(12) United States Patent
Hashimoto

(10) Patent No.: US 12,125,622 B2
(45) Date of Patent: Oct. 22, 2024

(54) MAGNETOPLUMBITE-TYPE HEXAGONAL FERRITE POWDER, RADIO WAVE ABSORBER, AND METHOD OF CONTROLLING RESONANCE FREQUENCY OF MAGNETOPLUMBITE-TYPE HEXAGONAL FERRITE POWDER

(71) Applicant: FUJIFILM Corporation, Tokyo (JP)

(72) Inventor: Hirokazu Hashimoto, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 95 days.

(21) Appl. No.: 17/469,166

(22) Filed: Sep. 8, 2021

(65) Prior Publication Data

US 2021/0407715 A1    Dec. 30, 2021

Related U.S. Application Data

(63) Continuation of application No. PCT/JP2019/049902, filed on Dec. 19, 2019.

(30) Foreign Application Priority Data

Mar. 19, 2019  (JP) .................................. 2019-051927
Jun. 25, 2019  (JP) .................................. 2019-117629

(51) Int. Cl.
*H01F 1/34*     (2006.01)
*C01G 49/06*    (2006.01)
(Continued)

(52) U.S. Cl.
CPC ............ *H01F 1/348* (2013.01); *C01G 49/06* (2013.01); *H05K 9/0075* (2013.01); *C01P 2002/76* (2013.01); *C01P 2006/42* (2013.01)

(58) Field of Classification Search
CPC ... H01F 1/348; H01F 1/34; H01F 1/37; H01F 1/344; H01F 1/346; H01F 1/36;
(Continued)

(56) References Cited

U.S. PATENT DOCUMENTS

2001/0023933 A1  9/2001  Ogata et al.
2004/0104836 A1  6/2004  Mukasa et al.
(Continued)

FOREIGN PATENT DOCUMENTS

CN    1256785 A      6/2000
CN    102030521 A    4/2011
(Continued)

OTHER PUBLICATIONS

Machine translaiton of RU-2373593-C2, 7 pages. (Year: 2009).*
(Continued)

*Primary Examiner* — Matthew E. Hoban
*Assistant Examiner* — Lynne Edmondson
(74) *Attorney, Agent, or Firm* — Sughrue Mion, PLLC

(57) ABSTRACT

A magnetoplumbite-type hexagonal ferrite powder containing a powder of a magnetoplumbite-type hexagonal ferrite represented by Formula (1) and a powder of a compound represented by Formula (2), in which a magnetic field strength Hα, which corresponds to 90% of a magnetization quantity obtained in a case where an external magnetic field of 50 kOe is applied, satisfies 19 kOe≤Hα≤28 kOe, a radio wave absorber, and a method of controlling resonance frequency of a magnetoplumbite-type hexagonal ferrite powder are provided. In Formula (1), A represents at least one metal element selected from the group consisting of Sr, Ba, Ca, and Pb, and x satisfies 1.5≤x≤8.0. In Formula (2), $A^a$ represents at least one metal element selected from the group consisting of Sr, Ba, Ca, and Pb.

$AFe_{(12-x)}Al_xO_{19}$                    Formula (1)

$A^a Al_2 O_4$                              Formula (2)

7 Claims, 1 Drawing Sheet

(51) Int. Cl.
  *H01F 1/36*    (2006.01)
  *H01F 1/37*    (2006.01)
  *H05K 9/00*    (2006.01)

(58) Field of Classification Search
  CPC .. C01G 49/06; C01G 49/0045; C01G 49/009; C01G 49/0018; C01P 2006/42; C01P 2002/52
  See application file for complete search history.

(56) References Cited

U.S. PATENT DOCUMENTS

| | | | |
|---|---|---|---|
| 2015/0170811 A1 | | 6/2015 | Tanigawa et al. |
| 2020/0156291 A1* | | 5/2020 | Iguchi .................. B29C 43/18 |
| 2020/0335247 A1 | | 10/2020 | Hosoya et al. |

FOREIGN PATENT DOCUMENTS

| | | | |
|---|---|---|---|
| EP | 3754673 A1 | | 12/2020 |
| JP | 2-066902 A | | 3/1990 |
| JP | 6-150297 A | | 5/1994 |
| JP | 11-354972 A | | 12/1999 |
| JP | 2004-104063 A | | 4/2004 |
| JP | 2007-250823 A | | 9/2007 |
| JP | 4674380 B2 | | 4/2011 |
| RU | 2373593 C2 | * | 11/2009 |
| WO | 2019/131675 A1 | | 7/2019 |

OTHER PUBLICATIONS

International Search Report dated Feb. 10, 2020 in International Application No. PCT/JP2019/049902.
Written Opinion of the International Searching Authority dated Feb. 10, 2020 in International Application No. PCT/JP2019/049902.
International Preliminary Report on Patentability dated Sep. 16, 2021 in International Application No. PCT/JP2019/049902.
Bashkirov S. et al., "Synthesis of the Aluminum-Substituted Hexaferrite $SrFe_{9.5}Al_{2.5}O_{19}$", Inorganic Materials, 1999, vol. 35, No. 12, pp. 1301-1305 (6 pages total).
Office Action dated May 17, 2022 issued by the Japanese Patent Office in Japanese Application No. 2021-506169.
Communication dated Nov. 8, 2022, issued in Chinese Application No. 201980094053.5.
Communication dated Nov. 23, 2022, issued in Korean Application No. 10-2021-7027114.
Extended European Search Report dated Apr. 19, 2022 in Application No. 19920317.5.
Xiao-Mei Ma et al., "Tuning of magnetic properties of aluminium-doped strontium hexaferrite powders", Chin. Phys. B. Oct. 25, 2016, vol. 25, No. 12 pp. 126102-1-126102-6 (6 pages total).
European Office Action dated Jun. 20, 2023 in European Application No. 19920317.5.
European Office Action issued Feb. 27, 2024 in Application No. 19 920 317.5.

* cited by examiner

MAGNETOPLUMBITE-TYPE HEXAGONAL FERRITE POWDER, RADIO WAVE ABSORBER, AND METHOD OF CONTROLLING RESONANCE FREQUENCY OF MAGNETOPLUMBITE-TYPE HEXAGONAL FERRITE POWDER

CROSS-REFERENCE TO RELATED APPLICATIONS

This application is a continuation application of International Application No. PCT/JP2019/049902, filed Dec. 19, 2019, the disclosure of which is incorporated herein by reference in its entirety. Further, this application claims priority from Japanese Patent Application No. 2019-051927, filed Mar. 19, 2019, and from Japanese Patent Application No. 2019-117629, filed Jun. 25, 2019, the disclosures of which are incorporated herein by reference in its entirety.

BACKGROUND OF THE INVENTION

1. Field of the Invention

The present disclosure relates to a magnetoplumbite-type hexagonal ferrite powder, a radio wave absorber, and a method of controlling a resonance frequency of a magnetoplumbite-type hexagonal ferrite powder.

2. Description of the Related Art

In recent years, along with the diversification of the use of radio waves in high frequency bands, such as electronic toll collection systems (ETC), advanced cruise-assist highway systems (AHS), and satellite broadcasting, malfunctions and failures of electronic devices due to radio wave interference have been problems. In order to reduce the influence of such radio wave interference on electronic devices, a radio wave absorber absorbs unnecessary radio waves to prevent the reflection of the radio waves.

As a radio wave absorber, a radio wave absorber using a magnetic material is often used. A radio wave incident to the radio wave absorber including a magnetic material generates a magnetic field in the magnetic material. In a case where the generated magnetic field is reduced to radio wave energy, part of the energy is lost and absorbed. Accordingly, in the radio wave absorber including the magnetic material, a frequency band in which the effect is obtained differs depending on the type of the magnetic material used.

For example, JP4674380B discloses a magnetic powder for a radio wave absorber in which a peak particle size of laser diffraction scattering particle size distribution is 10 μm or more in a powder of a magnetoplumbite-type hexagonal ferrite represented by a composition formula $AFe_{(12-x)}Al_xO_{19}$, in which A is one or more of Sr, Ba, Ca, and Pb, and x is 1.0 to 2.2. According to the magnetic powder for a radio wave absorber disclosed in JP4674380B, excellent radio wave absorption performance is exhibited near 76 GHz.

SUMMARY OF THE INVENTION

With the rapid development of information and communication technologies in recent years, the usage of radio waves is expected to become increasingly diversified in the future. Therefore, from the viewpoint of coping with radio waves with various frequencies, the development of a radio wave absorber capable of exhibiting excellent radio wave absorption performance in a target frequency band (particularly, 60 GHz to 90 GHz) is desired.

The inventors of the present inventions focused on a magnetoplumbite-type hexagonal ferrite in which a part of the iron is substituted with aluminum (hereinafter, also referred to as an "Al-substituted magnetoplumbite-type hexagonal ferrite") as a magnetic material suitable for a radio wave absorber. However, it is very difficult to match the resonance frequency of the Al-substituted magnetoplumbite-type hexagonal ferrite with a target frequency band.

In response to such a problem, the inventors of the present invention have found that there is a correlation between the ratio of aluminum atoms to iron atoms in an Al-substituted magnetoplumbite-type hexagonal ferrite and the resonance frequency of the Al-substituted magnetoplumbite-type hexagonal ferrite, and the resonance frequency of the Al-substituted magnetoplumbite-type hexagonal ferrite can be controlled to a desired value by adjusting the ratio of the aluminum atoms to the iron atoms in the Al-substituted magnetoplumbite-type hexagonal ferrite.

However, in the process of further study, the inventors of the present invention have found that in a case where an attempt is made to mass-produce a powder of the Al-substituted magnetoplumbite-type hexagonal ferrite by the solid phase method (the so-called method of obtaining a powder from a plurality of solid raw materials by firing), a certain amount of a compound containing Al but not containing Fe is produced as a by-product, and further, in a case where the above compound is present, the resonance frequency of the powder deviates from the resonance frequency designed in advance by adjusting the ratio of aluminum atoms to iron atoms in the Al-substituted magnetoplumbite-type hexagonal ferrite.

An object to be achieved by one aspect of the present invention is to provide a magnetoplumbite-type hexagonal ferrite powder having a desired resonance frequency in the frequency band of 60 GHz to 90 GHz.

An object to be achieved by another aspect of the present invention is to provide a radio wave absorber containing the above magnetoplumbite-type hexagonal ferrite powder.

Further, an object to be achieved by another aspect of the present invention is to provide a method of controlling a resonance frequency of a magnetoplumbite-type hexagonal ferrite powder, by which the resonance frequency of the magnetoplumbite-type hexagonal ferrite powder can be satisfactorily controlled in the frequency band of 60 GHz to 90 GHz.

A unit for achieving the objects includes the following aspects.

<1> A magnetoplumbite-type hexagonal ferrite powder, comprising:
  a powder of a magnetoplumbite-type hexagonal ferrite represented by Formula (1); and
  a powder of a compound represented by Formula (2),
  in which a magnetic field strength Hα, which corresponds to 90% of a magnetization quantity obtained in a case where an external magnetic field of 50 kOe is applied, satisfies 19 kOe≤Hα≤28 kOe.

$$AFe_{(12-x)}Al_xO_{19} \qquad \text{Formula (1)}$$

In Formula (1), A represents at least one metal element selected from the group consisting of Sr, Ba, Ca, and Pb, and x satisfies 1.5≤x≤8.0.

$$A^aAl_2O_4 \qquad \text{Formula (2)}$$

In Formula (2), $A^a$ represents at least one metal element selected from the group consisting of Sr, Ba, Ca, and Pb.

<2> The magnetoplumbite-type hexagonal ferrite powder according to <1>, in which A in Formula (1) comprises Sr.

<3> The magnetoplumbite-type hexagonal ferrite powder according to <1> or <2>, in which the magnetoplumbite-type hexagonal ferrite powder has been subjected to a surface treatment.

<4> A radio wave absorber, comprising:
the magnetoplumbite-type hexagonal ferrite powder according to any one of <1> to <3>; and
a binder,
in which the radio wave absorber has a planar shape.

<5> A radio wave absorber, comprising:
the magnetoplumbite-type hexagonal ferrite powder according to any one of <1> to <3>; and
a binder,
in which the radio wave absorber has a three-dimensional shape.

<6> A method of controlling a resonance frequency of a magnetoplumbite-type hexagonal ferrite powder, the method comprising:
adjusting a magnetic field strength Hα which corresponds to 90% of a magnetization quantity obtained in a case where an external magnetic field of 50 kOe is applied to a magnetoplumbite-type hexagonal ferrite powder within a range satisfying 19 kOe≤Hα≤28 kOe, the magnetoplumbite-type hexagonal ferrite powder comprising a powder of a magnetoplumbite-type hexagonal ferrite represented by Formula (1).

AFe$_{(12-x)}$Al$_x$O$_{19}$      Formula (1)

In Formula (1), A represents at least one metal element selected from the group consisting of Sr, Ba, Ca, and Pb, and x satisfies 1.5≤x≤8.0.

<7> The method according to <6>, in which the magnetoplumbite-type hexagonal ferrite powder comprises a compound represented by Formula (2).

A$^a$Al$_2$O$_4$      Formula (2)

In Formula (2), A$^a$ represents at least one metal element selected from the group consisting of Sr, Ba, Ca, and Pb.

According to one aspect of the present invention, a magnetoplumbite-type hexagonal ferrite powder having a desired resonance frequency in the frequency band of 60 GHz to 90 GHz is provided.

According to another aspect of the present invention, a radio wave absorber containing the above magnetoplumbite-type hexagonal ferrite powder is provided.

Further, according to another aspect of the present invention, a method of controlling a resonance frequency of a magnetoplumbite-type hexagonal ferrite powder, by which the resonance frequency of the magnetoplumbite-type hexagonal ferrite powder can be satisfactorily controlled in the frequency band of 60 GHz to 90 GHz, is provided.

DESCRIPTION OF THE PREFERRED EMBODIMENTS

Figure 1:
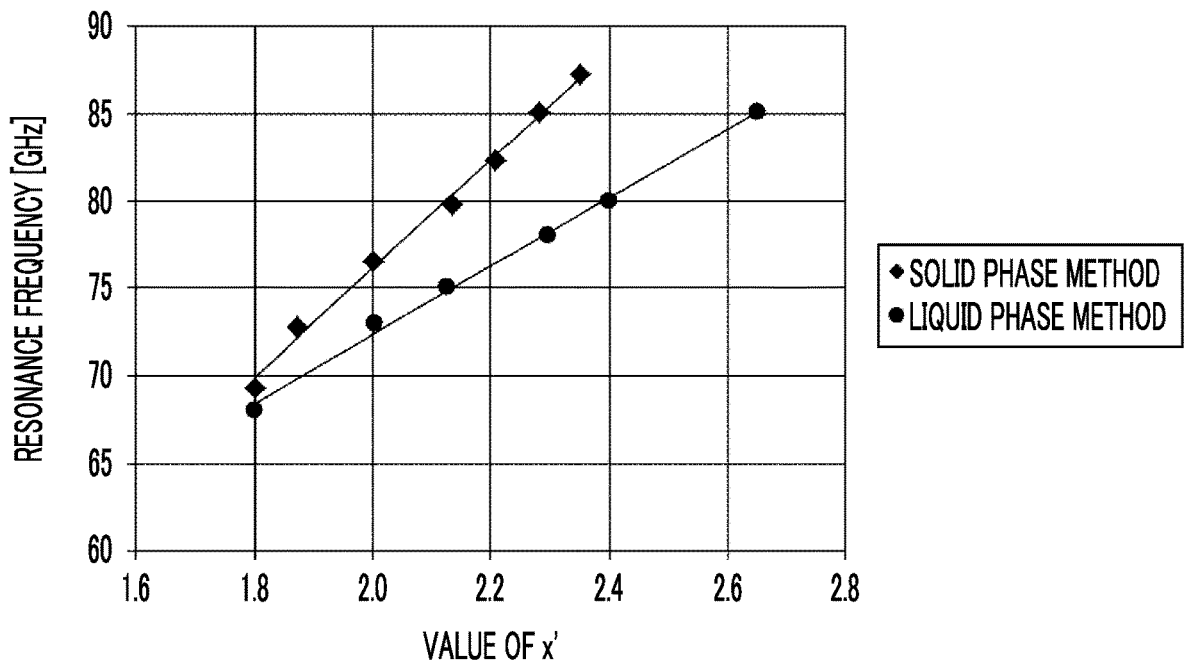
FIG. 1 is a graph showing a relationship between a value of x' and a resonance frequency in a powder A1 to a powder A7, prepared by the liquid phase method, and a relationship between the value of x' and a resonance frequency in a powder B1 to a powder B6, prepared by the solid phase method.

Hereinafter, an example of an embodiment of a magnetoplumbite-type hexagonal ferrite powder to which the present invention is applied will be described. Here, the present invention is not limited to the embodiments hereinafter, and modifications can be suitably added within the range of the object of the present invention.

A range of numerical values shown using "to" in the disclosure means a range including numerical values before and after "to" as a minimum value and a maximum value.

In the range of numerical values disclosed stepwise in the disclosure, an upper limit value and a lower limit value disclosed in a certain range of numerical values may be replaced with an upper limit value and a lower limit value disclosed in another range of numerical values disclosed in stepwise. In addition, in the range of numerical values disclosed in the disclosure, an upper limit value and a lower limit value disclosed in a certain range of numerical values may be replaced with values shown in examples.

In the disclosure, a combination of two or more preferred aspects is a more preferred aspect.

In the disclosure, in a case where plural kinds of substances corresponding to each component are present, an amount of each component means the amount of all of the plural kinds of substances, unless otherwise noted.

In the present disclosure, the term "step" includes not only an independent step but also a step that cannot be clearly distinguished from other steps, as long as the intended purpose of the step is achieved.

In the present disclosure, "x'" refers to the ratio of aluminum atoms to 100 atom % of iron atoms in the magnetoplumbite-type hexagonal ferrite powder.

In the present disclosure, the transformation coefficient from the non-SI unit "Oe" to the SI unit "A/m" is "$10^3/4\pi$". Here, "$\pi$" is 3.1416.

In the present disclosure, the transformation coefficient from the non-SI unit "emu" to the SI unit "A·m$^2$" is "$10^{-3}$".

[Magnetoplumbite-Type Hexagonal Ferrite Powder]

A magnetoplumbite-type hexagonal ferrite powder of the present disclosure contains a powder of a magnetoplumbite-type hexagonal ferrite represented by Formula (1) and a powder of a compound represented by Formula (2), where a magnetic field strength Hα, which corresponds to 90% of a magnetization quantity obtained in a case where an external magnetic field of 50 kOe is applied, satisfies 19 kOe≤Hα≤28 kOe.

Hereinafter, the "magnetic field strength Hα which is 90% of the magnetization quantity obtained in a case where an external magnetic field of 50 kOe is applied" is also referred to as the "magnetic field strength Hα" or "Hα".

The inventors of the present inventions focused on a magnetoplumbite-type hexagonal ferrite in which a part of the iron was substituted with aluminum (that is, an Al-substituted magnetoplumbite-type hexagonal ferrite) as a magnetic material suitable for a radio wave absorber. However, it is very difficult to match the resonance frequency of the Al-substituted magnetoplumbite-type hexagonal ferrite with a target frequency band.

On the other hand, the inventors of the present invention have carried out the diligent study and found that there is a correlation between the ratio of aluminum atoms to iron atoms in an Al-substituted magnetoplumbite-type hexagonal ferrite and the resonance frequency of the Al-substituted magnetoplumbite-type hexagonal ferrite, and the resonance frequency of the Al-substituted magnetoplumbite-type hexagonal ferrite can be controlled to a desired value by adjusting the ratio of the aluminum atoms to the iron atoms in the Al-substituted magnetoplumbite-type hexagonal ferrite.

On the other hand, the inventors of the present invention have found that in a case where an attempt is made to mass-produce a powder of the Al-substituted magnetoplumbite-type hexagonal ferrite by the solid phase method, a certain amount of a compound [in detail, a compound represented by Formula (2) in the present disclosure] containing Al but not containing Fe is produced as a by-product. In a case where the above compound is contained in the powder obtained by producing the Al-substituted magnetoplumbite-type hexagonal ferrite, the resonance frequency of the powder may deviate from the resonance frequency designed in advance by adjusting the ratio of aluminum atoms to iron atoms in the Al-substituted magnetoplumbite-type hexagonal ferrite.

On the other hand, since the magnetoplumbite-type hexagonal ferrite powder of the present disclosure contains a powder of a magnetoplumbite-type hexagonal ferrite represented by Formula (1), and the magnetic field strength $H\alpha$, which corresponds to 90% of a magnetization quantity obtained in a case where an external magnetic field of 50 kOe is applied, satisfies 19 kOe≤$H\alpha$≤28 kOe, the magnetoplumbite-type hexagonal ferrite powder has a desired resonance frequency in the frequency band of 60 GHz to 90 GHz although it contains the powder of the compound represented by Formula (2). The magnetic field strength $H\alpha$, which corresponds to 90% of a magnetization quantity obtained in a case where an external magnetic field of 50 kOe is applied, is not easily affected by the presence of the powder of the compound represented by Formula (2). For this reason, it is presumed that the magnetoplumbite-type hexagonal ferrite powder has a desired resonance frequency in the frequency band of 60 GHz to 90 GHz although it contains the powder of the compound represented by Formula (2).

Regarding the points described above, JP4674380B does not describe at all the adjustment of the resonance frequency of the magnetoplumbite-type hexagonal ferrite to the target frequency band. Further, JP4674380B does not describe at all the fact that in a case where an attempt is made to mass-produce the powder of the magnetoplumbite-type hexagonal ferrite by the solid phase method, a certain amount of the powder of the compound represented by Formula (2) is produced.

It is noted that the above presumption does not limitedly interpret the magnetoplumbite-type hexagonal ferrite powder of the present disclosure and is described as an example.

[Magnetic Properties of Magnetoplumbite-Type Hexagonal Ferrite Powder]

In the magnetoplumbite-type hexagonal ferrite powder of the present disclosure, a magnetic field strength $H\alpha$, which corresponds to 90% of a magnetization quantity obtained in a case where an external magnetic field of 50 kOe is applied, satisfies 19 kOe≤$H\alpha$≤28 kOe.

In the magnetoplumbite-type hexagonal ferrite powder of the present disclosure, the magnetic field strength $H\alpha$ and the resonance frequency show a correlation. In the present disclosure, "19 kOe≤$H\alpha$≤28 kOe" means "60 GHz≤resonance frequency≤90 GHz". For example, an aspect in which the magnetoplumbite-type hexagonal ferrite powder of the present disclosure is used for a millimeter wave radar having a frequency band of 60 GHz to 90 GHz is considered, and thus the magnetic field strength $H\alpha$ satisfies 19 kOe≤$H\alpha$≤28 kOe.

The magnetic field strength $H\alpha$ preferably satisfies 20 kOe≤$H\alpha$≤27 kOe, more preferably 21 kOe≤$H\alpha$≤26 kOe, and still more preferably 22 kOe≤$H\alpha$≤25 kOe.

The magnetic field strength $H\alpha$ of the magnetoplumbite-type hexagonal ferrite powder of the present disclosure is a value obtained by the following method.

Using a vibrating sample magnetometer, the intensity of magnetization of the magnetoplumbite-type hexagonal ferrite powder is measured with respect to an applied magnetic field under the conditions of a maximum applied magnetic field of 50 kOe and a magnetic field sweep rate of 25 Oe/s (seconds) in an environment with an ambient temperature of 23° C. Then, based on the measurement result, a magnetic field (H)-magnetization (M) curve of the magnetoplumbite-type hexagonal ferrite powder is obtained. Based on the obtained magnetic field (H)-magnetization (M) curve, a magnetic field strength which corresponds to 90% of a magnetization quantity at an applied magnetic field of 50 kOe is obtained, and this magnetic field strength is denoted by $H\alpha$.

As the vibrating sample magnetometer, for example, TM-TRVSM5050-SMSL (product name) manufactured by Tamagawa Manufacturing Co., Ltd. can be suitably used. However, the vibrating sample magnetometer is not limited thereto.

The coercive force (Hc) of the magnetoplumbite-type hexagonal ferrite powder of the present disclosure is not particularly limited; however, it is, for example, preferably 2.5 kOe or more, more preferably 4.0 kOe or more, and still more preferably 5.0 kOe or more.

In a case where the coercive force (Hc) of the magnetoplumbite-type hexagonal ferrite powder of the present disclosure is 2.5 kOe or more, it is possible to produce a radio wave absorber having excellent radio wave absorption performance.

The upper limit of the coercive force (Hc) of the magnetoplumbite-type hexagonal ferrite powder of the present disclosure is not particularly limited; however, it is, for example, preferably 18 kOe or less.

The saturation magnetization ($\delta s$) per unit mass of the magnetoplumbite-type hexagonal ferrite powder of the present disclosure is not particularly limited; however, it is, for example, preferably 10 emu/g or more, more preferably 20 emu/g or more, and still more preferably 30 emu/g or more.

In a case where the saturation magnetization ($\delta s$) per unit mass of the magnetoplumbite-type hexagonal ferrite powder of the present disclosure is 10 emu/g or more, it is possible to produce a radio wave absorber having more excellent radio wave absorption performance.

The upper limit of the saturation magnetization ($\delta s$) per unit mass of the magnetoplumbite-type hexagonal ferrite powder of the present disclosure is not particularly limited; however, it is, for example, preferably 60 emu/g or less.

The coercive force (Hc) and the saturation magnetization ($\delta s$) per unit mass of the magnetoplumbite-type hexagonal ferrite powder of the present disclosure are values measured using a vibrating sample magnetometer under an environment of an ambient temperature of 23° C. and conditions of a maximum applied magnetic field of 50 kOe and a magnetic field sweep rate of 25 Oe/s (second).

As the vibrating sample magnetometer, for example, TM-TRVSM5050-SMSL (product name) manufactured by Tamagawa Manufacturing Co., Ltd. can be suitably used. However, the vibrating sample magnetometer is not limited thereto.

<Powder of Magnetoplumbite-Type Hexagonal Ferrite Represented by Formula (1)>

The magnetoplumbite-type hexagonal ferrite powder of the present disclosure contains a powder (a so-called aggregate of particles) of a magnetoplumbite-type hexagonal ferrite (hereinafter, also referred to as a "specific magnetoplumbite-type hexagonal ferrite") represented by Formula (1).

$$AFe_{(12-x)}Al_xO_{19} \quad \text{Formula (1)}$$

In Formula (1), A represents at least one metal element selected from the group consisting of Sr, Ba, Ca, and Pb, and x satisfies $1.5 \leq x \leq 8.0$.

Regarding the A in Formula (1), the kind or number of metal elements are not particularly limited as long as the A is at least one metal element selected from the group consisting of Sr, Ba, Ca, and Pb.

For example, from the viewpoint of operability and handleability, the A in Formula (1) is preferably at least one metal element selected from the group consisting of Sr, Ba, and Ca.

In addition, the A in Formula (1) preferably contains Sr and is more preferably Sr, due to the fact that an excellent radio wave absorption performance is exhibited near 79 GHz.

x in Formula (1) satisfies $1.5 \leq x \leq 8.0$, preferably satisfies $1.5 \leq x \leq 6.0$, more preferably satisfies $1.5 \leq x \leq 4.0$, and still more preferably satisfies $1.5 \leq x \leq 3.0$.

In a case where x in Formula (1) is 1.5 or more, radio waves in a frequency band higher than 60 GHz can be absorbed.

In a case where x in Formula (1) is 8.0 or less, the magnetoplumbite-type hexagonal ferrite has magnetism.

Examples of the specific magnetoplumbite-type hexagonal ferrite include $SrFe_{(10.44)}Al_{(1.56)}O_{19}$, $SrFe_{(10.26)}Al_{(1.74)}O_{19}$, $SrFe_{(10.10)}Al_{(1.90)}O_{19}$, $SrFe_{(10.04)}Al_{(1.96)}O_{19}$, $SrFe_{(10.00)}Al_{(2.00)}O_{19}$, $SrFe_{(9.95)}Al_{(2.05)}O_{19}$, $SrFe_{(9.94)}Al_{(2.06)}O_{19}$, $SrFe_{(9.88)}Al_{(2.12)}O_{19}$, $SrFe_{(9.85)}Al_{(2.15)}O_{19}$, $SrFe_{(9.79)}Al_{(2.21)}O_{19}$, $SrFe_{(9.74)}Al_{(2.26)}O_{19}$, $SrFe_{(9.71)}Al_{(2.29)}O_{19}$, $SrFe_{(9.58)}Al_{(2.42)}O_{19}$, $SrFe_{(9.37)}Al_{(2.63)}O_{19}$, $SrFe_{(9.33)}Al_{(2.67)}O_{19}$, $SrFe_{(9.27)}Al_{(2.73)}O_{19}$, $SrFe_{(7.88)}Al_{(4.12)}O_{19}$, $SrFe_{(7.71)}Al_{(4.29)}O_{19}$, $SrFe_{(7.37)}Al_{(4.63)}O_{19}$, $SrFe_{(7.04)}Al_{(4.96)}O_{19}$, $SrFe_{(6.25)}Al_{(5.75)}O_{19}$, $BaFe_{(9.50)}Al_{(2.50)}O_{19}$, $BaFe_{(10.05)}Al_{(1.95)}O_{19}$, $CaFe_{(10.00)}Al_{(2.00)}O_{19}$, $PbFe_{(9.00)}Al_{(3.00)}O_{19}$, $Sr_{(0.80)}Ba_{(0.10)}Ca_{(0.10)}Fe_{(9.83)}Al_{(2.17)}O_{19}$, and $Sr_{(0.80)}Ba_{(0.10)}Ca_{(0.10)}Fe_{(8.85)}Al_{(3.15)}O_{19}$.

The composition of the specific magnetoplumbite-type hexagonal ferrite is confirmed by high frequency inductively coupled plasma (ICP) emission spectroscopy.

Specifically, a pressure-resistant container containing 12 mg of sample powder and 10 mL of a 4 mol/L (liter; the same applies hereinafter) hydrochloric acid aqueous solution is held in an oven at a set temperature of 120° C. for 12 hours to obtain a dissolution solution. Next, 30 mL of pure water is added to the obtained dissolution solution, which is then filtered using a 0.1 μm membrane filter. Elemental analysis of the filtrate obtained as described above is carried out using a high frequency inductively coupled plasma (ICP) emission spectrometer. Based on the obtained elemental analysis results, a content of each metal atom with respect to 100 atom % of iron atoms is obtained. The composition is confirmed based on the obtained content.

As the ICP emission spectrometer, for example, ICPS-8100 (model number) manufactured by Shimadzu Corporation can be suitably used. However, the ICP emission spectrometer is not limited thereto.

A crystal phase of the specific magnetoplumbite-type hexagonal ferrite may be or may not be a single phase; however, it is preferably a single phase.

In a case where the content of aluminum is the same, the specific magnetoplumbite-type hexagonal ferrite having a single crystal phase tends to have a high coercive force and more excellent magnetic properties, as compared with a specific magnetoplumbite-type hexagonal ferrite not having a single crystal phase (for example, having two crystal phases).

In the disclosure, the description "the crystal phase is a single phase" indicates that only one kind of diffraction pattern showing a crystal structure of the specific magnetoplumbite-type hexagonal ferrite having any composition is observed in powder X-ray diffraction (XRD) measurement.

On the other hand, in the disclosure, the description "the crystal phase is not a single phase" indicates that there is such a case where a plurality of specific magnetoplumbite-type hexagonal ferrites of any composition are mixed, and two or more kinds of diffraction patterns are observed or a crystal diffraction pattern other than that of the specific magnetoplumbite-type hexagonal ferrite are observed.

In a case where the crystal phase is not a single phase, a diffraction pattern having a main peak and other peaks is obtained. Here, the "main peak" refers to a peak having the highest value of diffraction intensity in the observed diffraction pattern.

In a case where the magnetoplumbite-type hexagonal ferrite powder of the present disclosure contains a specific magnetoplumbite-type hexagonal ferrite powder that is not a single phase, a ratio (Is/Im) of a value of the diffraction intensity of the other peak (hereinafter, referred to as "Is") to a value of the diffraction intensity of the main peak (hereinafter, referred to as "Im") obtained by powder X-ray diffraction (XRD) measurement is, for example, preferably ½ or less more preferably ⅕ or less, from the viewpoint of producing a radio wave absorber having more excellent radio wave absorption performance.

In a case where two or more types of diffraction patterns are overlapped with each other and the peaks of the diffraction patterns have maximum values, the respective maximum values are defined as Im and Is, and the ratio thereof is obtained. In addition, in a case where two or more types of diffraction patterns are overlapped with each other and the other peak is observed as a shoulder of the main peak, the maximum intensity value of the shoulder is defined as Is and the ratio thereof is obtained.

In addition, in a case where there are two or more other peaks, a total value of the respective diffraction intensities is defined as Is, and the ratio thereof is obtained.

For the attribute of the diffraction pattern, for example, a database of the International Centre for Diffraction Data (ICDD: registered trade mark) can be referred to.

For example, regarding the diffraction pattern of the magnetoplumbite-type hexagonal ferrite containing Sr, "00-033-1340" of the International Centre for Diffraction Data (ICDD) can be referred to. However, in a case where a part of iron is substituted with aluminum, the peak position shifts.

As described above, the single crystal phase of the specific magnetoplumbite-type hexagonal ferrite is confirmed by the powder X-ray diffraction (XRD) measurement.

Specifically, a powder X-ray diffractometer is used and the measurement is carried out under the following conditions.

As the powder X-ray diffractometer, for example, an X'Pert Pro (product name) manufactured by PANalytical can be suitably used. However, the powder X-ray diffractometer is not limited thereto.
—Conditions—
X-ray source: CuKα ray
[Wavelength: 1.54 Å (0.154 nm), output: 40 mA, 45 kV]
Scan range: 20°<2θ<70°
Scan interval: 0.05°
Scan speed: 0.75°/min The shape of the specific magnetoplumbite-type hexagonal ferrite particles is not particularly limited.

The shape of the specific magnetoplumbite-type hexagonal ferrite particles is, for example, a flat plate shape, an irregular shape, or the like.

The size of the particles of the specific magnetoplumbite-type hexagonal ferrite is not particularly limited.

In the powder of the specific magnetoplumbite-type hexagonal ferrite, for example, a diameter ($D_{50}$) at a cumulative percentage of 50% in a particle size distribution based on the particle number, which is measured by a laser diffraction scattering method, is 2 μm to 100 μm.

The diameter ($D_{50}$) of the powder of the specific magnetoplumbite-type hexagonal ferrite at a cumulative percentage of 50% is specifically a value measured by the following method.

500 mL of cyclohexanone is added to 10 mg of the powder of the specific magnetoplumbite-type hexagonal ferrite and diluted, stirred using a shaker for 30 seconds, and the obtained liquid is set as a sample for particle size distribution measurement. Then, the particle size distribution is measured by the laser diffraction scattering method using the sample for particle size distribution measurement. A laser diffraction/scattering particle size distribution measurement device is used as the measurement device.

As the laser diffraction/scattering particle size distribution measurement device, for example, Partica LA-960 (product name) manufactured by Horiba, Ltd. can be suitably used. However, the laser diffraction/scattering particle size distribution measurement device is not limited thereto.

The magnetoplumbite-type hexagonal ferrite powder of the present disclosure may contain only one kind of the powder of the specific magnetoplumbite-type hexagonal ferrite or may contain two or more kinds thereof.

The content of the powder of the specific magnetoplumbite-type hexagonal ferrite in the magnetoplumbite-type hexagonal ferrite powder of the present disclosure is not particularly limited; however, from the viewpoint that a radio wave absorber having more excellent radio wave absorption performance can be produced, it is, for example, preferably 80% by mass or more, more preferably 90% by mass or more, and still more preferably 95% by mass or more, with respect to the total mass of the magnetoplumbite-type hexagonal ferrite powder.

The upper limit of the content of the powder of the specific magnetoplumbite-type hexagonal ferrite in the magnetoplumbite-type hexagonal ferrite powder of the present disclosure is not particularly limited, and for example, 99% by mass or less with respect to the total mass of the magnetoplumbite-type hexagonal ferrite powder is mentioned.

<Powder of Compound Represented by Formula (2)>

The magnetoplumbite-type hexagonal ferrite powder of the present disclosure contains a powder (a so-called aggregate of particles) of a compound (hereinafter, also referred to as a "specific compound") represented by Formula (2).

The origin of the specific compound contained in the magnetoplumbite-type hexagonal ferrite powder of the present disclosure is not particularly limited.

According to the study of the inventors of the present invention, it is known that the specific compound is a compound produced in a certain amount as a by-product in the process of producing the powder of the specific magnetoplumbite-type hexagonal ferrite. However, the specific compound is not limited to those derived from such a production method.

For example, the magnetoplumbite-type hexagonal ferrite powder of the present disclosure may contain a specific compound by intentional addition or may inevitably contain a specific compound.

$$A^a Al_2 O_4 \qquad \text{Formula (2)}$$

In Formula (2), $A^a$ represents at least one metal element selected from the group consisting of Sr, Ba, Ca, and Pb.

Regarding $A^a$ in Formula (2), the kind or number of metal elements are not particularly limited as long as the $A^a$ is at least one metal element selected from the group consisting of Sr, Ba, Ca, and Pb.

The $A^a$ in Formula (2) generally corresponds to the kind of the A in Formula (1).

Examples of the specific compound include $SrAl_2O_4$, $BaAl_2O_4$, $CaAl_2O_4$, and $PbAl_2O_4$.

For example, in a case where the Ain Formula (1) is Sr, Ba, and Ca, examples of the specific compound include at least one selected from the group consisting of $SrAl_2O_4$, $BaAl_2O_4$, and $CaAl_2O_4$.

The shape of the particles of the specific compound is not particularly limited.

The shape of the particles of the specific compound is, for example, a flat plate shape, an irregular shape, or the like.

The size of the particles of the specific compound is not particularly limited.

In the powder of the specific compound, for example, a diameter ($D_{50}$) at a cumulative percentage of 50% in a particle size distribution based on the particle number, which is measured by a laser diffraction scattering method, is 2 μm to 100 μm.

The diameter ($D_{50}$) of the powder of the specific compound at a cumulative percentage of 50% is measured by the same method as the diameter ($D_{50}$) of the powder of the specific magnetoplumbite-type hexagonal ferrite at a cumulative percentage of 50% described above, and thus the description thereof is omitted here.

The magnetoplumbite-type hexagonal ferrite powder of the present disclosure may contain only one kind of specific compound or may contain two or more kinds thereof.

The content of the specific compound in the magnetoplumbite-type hexagonal ferrite powder of the present disclosure is not particularly limited; however, from the viewpoint of further suppressing the decrease in the magnetic properties of the magnetoplumbite-type hexagonal ferrite powder due to the inclusion of the specific compound having no magnetism, it is preferably 20% by mass or less, more preferably 10% by mass or less, and still more preferably 5% by mass or less, with respect to the total mass of the magnetoplumbite-type hexagonal ferrite powder.

The lower limit of the content of the specific compound in the magnetoplumbite-type hexagonal ferrite powder of the present disclosure is not particularly limited, and is, for example, 1% by mass or more with respect to the total mass of the magnetoplumbite-type hexagonal ferrite powder is mentioned.

Even in a case of containing, for example, 10% by mass or more of the specific compound with respect to the total mass of the magnetoplumbite-type hexagonal ferrite powder, the magnetoplumbite-type hexagonal ferrite powder of the present disclosure has a desired resonance frequency in the frequency band of 60 GHz to 90 GHz.

The content of the specific compound in the magnetoplumbite-type hexagonal ferrite powder of the present disclosure is measured by the powder X-ray diffraction (XRD) method using a standard sample of the specific compound.

Specifically, the measurement is carried out according to the method described in Examples described later.

The magnetoplumbite-type hexagonal ferrite powder of the present disclosure is preferably surface-treated.

According to the surface-treated powder, it is possible to realize a radio wave absorber having excellent radio wave absorption performance, particularly, having an excellent balance between the return loss and the transmission attenuation amount. According to the surface-treated powder, in particular, it is possible to increase the peak return loss of the radio wave absorber.

Further, in a case where the powder is surface-treated, handleability and workability are not easily impaired even in a case where a large amount of powder is incorporated in the composition (the so-called composition for forming a radio wave absorber) that is used for forming the radio wave absorber.

Further, in a case where the composition for forming a radio wave absorber contains a powder that has been surface-treated, the mechanical strength of the radio wave absorber to be formed can be improved.

Although it is not clear why the above-described effects are exhibited by the surface-treated powder, the inventors of the present invention presume as follows.

In a case where the powder is surface-treated, the cohesive force between the particles constituting the powder is weakened, and the aggregation between the particles is suppressed. In a case where the aggregation of the particles is suppressed, the viscosity of the composition for forming a radio wave absorber is difficult to increase. For this reason, it is conceived that the composition for forming a radio wave absorber exhibits sufficient fluidity even in a case where a large amount of powder is contained, and thus the handleability and the workability are not easily impaired.

Further, in a case where the powder is surface-treated, the affinity between the powder and the binder is enhanced. By weakening the cohesive force between the particles constituting the powder and increasing the affinity between the powder and the binder, the powder is more uniformly dispersed in the binder. For this reason, it is conceived that in the radio wave absorber to be formed, the variation in the radio wave absorption performance hardly occurs, and an excellent mechanical strength is exhibited.

A known surface treatment technique can be applied to the magnetoplumbite-type hexagonal ferrite powder of the present disclosure.

Examples of the kinds of surface treatment include an oil treatment with hydrocarbon oil, ester oil, lanolin, or the like; a silicone treatment with dimethylpolysiloxane, methylhydrogenpolysiloxane, methylphenylpolysiloxane, or the like; a fluorine compound treatment with a perfluoroalkyl group-containing ester, perfluoroalkylsilane, a polymer having a perfluoropolyether and a perfluoroalkyl group, or the like; a silane coupling agent treatment with 3-methacryloxypropyltrimethoxysilane, 3-glycidoxypropyltrimethoxysane, N-2-(aminoethyl)-3-aminopropyltrimethoxysilane, or the like; a titanium coupling agent treatment with isopropyltriisostearoyl titanate, isopropyltris(dioctylpyrophosphate)titanate, or the like; a metal soap treatment; an amino acid treatment with acylglutamic acid or the like; a lecithin treatment with hydrogenated egg yolk lecithin or the like; a polyethylene treatment; a mechanochemical treatment; and a phosphoric acid compound treatment with phosphoric acid, phosphorous acid, a phosphate, a phosphite, or the like.

Among these, a phosphoric acid compound treatment is preferable as the kind of the surface treatment.

In a case where the powder is subjected to a phosphoric acid compound treatment, it is possible to thickly form a highly polar layer on the surface of the particles constituting the powder.

In a case where a highly polar layer is formed on the surface of the particles, the aggregation due to hydrophobic interaction between the particles is suppressed, and thus it is possible to more effectively suppress the increase in the viscosity of the composition for forming a radio wave absorber. As a result, in the case of the powder subjected to the phosphoric acid compound treatment, the decrease in the fluidity of the composition for forming a radio wave absorber due to the incorporation of a large amount of the powder hardly is difficult to occur, and the handleability and the workability tend to be less impaired.

Further, in a case where a highly polar layer is formed on the surface of the particles, not only the aggregation of the particles is suppressed, but also the affinity between the powder and the binder is further enhanced, and thus the powder is dispersed more uniformly in the binder. Therefore, in the radio wave absorber formed from the composition for forming a radio wave absorber containing the powder subjected to the phosphoric acid compound treatment, the variation in the radio wave absorption performance hardly occurs, and an excellent mechanical strength is exhibited.

In addition to phosphoric acid, the phosphoric acid compound includes phosphorous acid, hypophosphorous acid, pyrophosphoric acid, a linear polyphosphoric acid, a cyclic metaphosphoric acid, and salts thereof.

In a case where the phosphoric acid compound has a form of a salt, the phosphoric acid compound is preferably a metal salt.

The metal salt is not particularly limited, and examples thereof include an alkali metal salt and an alkaline earth metal salt.

In addition, the phosphoric acid compound may be an ammonium salt.

In the phosphoric acid compound treatment, only one kind of phosphoric acid compound may be used, or two or more kinds thereof may be used.

In the phosphoric acid compound treatment, the phosphoric acid compound is generally mixed with a chelating agent, a neutralizing agent, and the like to be used as the surface treatment agent.

In the phosphoric acid compound treatment, as the surface treatment agent, an aqueous solution containing a phosphoric acid compound which is generally commercially available can also be used.

The phosphoric acid compound treatment of the powder can be carried out, for example, by mixing the powder and a surface treatment agent containing a phosphoric acid compound. Conditions such as mixing time and temperature may be appropriately set depending on the intended purpose. In the phosphoric acid compound treatment, an insoluble phosphoric acid compound is precipitated on the surface of particles constituting the powder by utilizing the dissociation (the equilibrium) reaction of the phosphoric acid compound.

Regarding the phosphoric acid compound treatment, for example, "Surface Technology", Vol. 61, No. 3, p 216, 2010, or "Surface Technology", Vol. 64, No. 12, p 640, 2013 can be referred to.

Further, as the kind of the surface treatment, a silane coupling agent treatment is preferable.

The silane coupling agent is preferably a silane coupling agent having a hydrolyzable group.

In the silane coupling agent treatment using a silane coupling agent having a hydrolyzable group, the hydrolyzable group in the silane coupling agent is hydrolyzed by water to become a hydroxyl group, and this hydroxyl group undergoes a condensation reaction with a hydroxyl group on the surface of the silica particles, whereby the surface of the particles is modified.

Examples of the hydrolyzable group include an alkoxy group, an acyloxy group, and a halogeno group.

The silane coupling agent may have a hydrophobic group as a functional group.

Examples of the silane coupling agent having a hydrophobic group as a functional group include alkoxysilanes such as methyltrimethoxysilane (MTMS), dimethyldimethoxysilane, phenyltrimethoxysilane, methyltriethoxysilane, dimethyldiethoxysilane, phenyltriethoxysilane, n-propyltrimethoxysilanes, n-propyltriethoxysilane, hexyltrimethoxysilane, hexyltriethoxysilane, and decyltrimethoxysilane; chlorosilanes such as methyltrichlorosilane, dimethyldichlorosilane, trimethylchlorosilane, and phenyltrichlorosilane; and hexamethyldisilazane (HMDS).

Further, the silane coupling agent may have a vinyl group as a functional group.

Examples of the silane coupling agent having a vinyl group as a functional group include alkoxysilanes such as methacryloxypropyltriethoxysilane, methacryloxypropyltrimethoxysilane, methacryloxypropylmethyldiethoxysilane, methacryloxypropylmethyldimethoxysilane, vinyltriethoxysilane, vinyltrimethoxysilane, vinylmethyldimethoxysilane; chlorosilanes such as vinyltrichlorosilane and vinylmethyldichlorosilane; and divinyltetramethyldisilazane.

In the silane coupling agent treatment, only one kind of silane coupling agent may be used, or two or more kinds thereof may be used.

The surface treatment method is not particularly limited, and a known method can be applied.

Examples of the surface treatment method includes a method of mixing a powder and a surface treatment agent using a mixer such as a henshel mixer, a method of spraying a surface treatment agent or the like on particles constituting the powder, and a method of mixing a liquid containing a surface treatment agent or the like, which is obtained by dissolving or dispersing a surface treatment agent or the like in an appropriate solvent, with a powder, and then removing the solvent.

[Method of Producing Magnetoplumbite-Type Hexagonal Ferrite Powder]

The method of producing a magnetoplumbite-type hexagonal ferrite powder of the present disclosure is not particularly limited, and examples thereof include a method in which a magnetoplumbite-type hexagonal ferrite (that is, the specific magnetoplumbite-type hexagonal ferrite) represented by Formula (1) is produced as a main product, and a compound (that is, the specific compound) represented by Formula (2) is produced as a by-product.

The inventors of the present invention have found that in a case where an attempt is made to mass-produce the powder of the magnetoplumbite-type hexagonal ferrite (that is, the specific magnetoplumbite-type hexagonal ferrite) represented by Formula (1) by the solid phase method, a certain amount of a compound (that is, a specific compound) represented by Formula (2) is produced as a by-product.

Accordingly, the method of producing a magnetoplumbite-type hexagonal ferrite powder of the present disclosure is preferably a method of producing a magnetoplumbite-type hexagonal ferrite powder by the solid phase method.

The method of producing a magnetoplumbite-type hexagonal ferrite powder of the present disclosure by the solid phase method is not particularly limited; however, it is, for example, preferably a method (hereinafter, referred to as a "production method X") described below.

The production method X includes a step A of mixing an inorganic compound containing Fe, an inorganic compound containing Al, and an inorganic compound containing at least one metal element (hereinafter, also referred to as a "specific metal element") selected from the group consisting of Sr, Ba, Ca, and Pb to obtain a mixture, and a step B which is any one of a step (hereinafter, also referred to as a "b1 step") of pulverizing the mixture obtained in the step A to obtain a pulverized product and then firing the obtained pulverized product or a step (hereinafter, also referred to as a "b2 step") of firing the mixture obtained in the step A to obtain a fired product and then pulverizing the obtained fired product.

The step A and the step B may each be divided into two or more stages.

The production method X may include a step other than step A and the step B, as necessary.

Hereinafter, each step will be described in detail.

(Step A)

The step A is a step of mixing an inorganic compound containing Fe, an inorganic compound containing Al, and an inorganic compound containing at least one metal element (that is a "specific metal element") selected from the group consisting of Sr, Ba, Ca, and Pb to obtain a mixture.

Examples of the inorganic compound containing Fe include an oxide containing Fe, such as iron (III) oxide [$\alpha$-$Fe_2O_3$]; iron (III) chloride; and iron (III) nitrate.

Examples of the inorganic compound containing Al include an oxide containing Al, such as aluminum oxide [$Al_2O_3$]; and aluminum hydroxide.

Examples of the inorganic compound containing a specific metal element include a carbonate containing a specific metal element, such as strontium carbonate [$SrCO_3$], barium carbonate, calcium carbonate, or lead carbonate; and a chloride containing a specific metal element, such as strontium chloride, barium chloride, or calcium chloride.

The inorganic compound containing Fe, the inorganic compound containing Al, and the inorganic compound containing a specific metal element may be simply mixed.

Hereinafter, the inorganic compound containing Fe, the inorganic compound containing Al, and the inorganic compound containing a specific metal element are also referred to as the "raw material".

As the raw material, the whole amount may be mixed at once, or the inorganic compound containing Fe, the inorganic compound containing Al, and the inorganic compound containing a specific metal element may be gradually mixed little by little.

For example, from the viewpoint of reducing the amount of the specific compound to be produced, it is preferable to gradually mix the inorganic compound containing Fe, the inorganic compound containing Al, and the inorganic compound containing the specific metal element little by little.

The method of mixing the inorganic compound containing Fe, the inorganic compound containing Al, and the inorganic compound containing a specific metal element is not particularly limited, and examples thereof include a method of mixing by stirring.

A stirring unit is not particularly limited, and a general stirring device can be used.

As the stirring device, a mixer such as a paddle mixer or an impeller mixer is used.

The stirring time is not particularly limited, and for example, can be appropriately set depending on the formulation amount of the raw material, the kind of the stirring device, and the like.

The mixing ratio between the inorganic compound containing Fe, the inorganic compound containing Al, and the inorganic compound containing a specific metal element is not particularly limited and can be appropriately set according to the composition of the targeted specific magnetoplumbite-type hexagonal ferrite.

The magnetic field strength Hα can be adjusted in the step A by changing, for example, the kind of the raw material, the particle size of the raw material, the amount of the raw material to be used, the method of mixing the raw material, and the like of the magnetoplumbite-type hexagonal ferrite powder.

Specifically, for example, the value of the magnetic field strength Hα can be increased by increasing the formulation ratio of the inorganic compound containing Al to the inorganic compound containing Fe, which is used as a raw material. Further, for example, the value of the magnetic field strength Hα can be increased by reducing the particle size of the inorganic compound containing Al, which is used as a raw material.

(Step B)

The step B is any one of a step (that is a "b1 step") of pulverizing the mixture obtained in the step A to obtain a pulverized product and then firing the obtained pulverized product or a step (that is a "b2 step") of firing the mixture obtained in the step A to obtain a fired product and then pulverizing the obtained fired product.

The magnetoplumbite-type hexagonal ferrite powder can be obtained by obtaining a fired product by firing the mixture obtained in the step A and pulverizing the obtained fired product or obtaining a pulverized product by pulverizing the mixture obtained in the step A and firing the obtained pulverized product.

The step B may be the b1 step or the b2 step.

For example, from the viewpoint of making the magnetic properties after firing more uniform, the step B is preferably the step b2.

The firing can be carried out using a heating device.

The heating device is not particularly limited as long as it can heat to a targeted temperature, and any well known heating device can be used. As the heating device, for example, in addition to an electric furnace, a firing device uniquely produced according to a production line can be used.

The firing is preferably carried out in the atmosphere.

The firing temperature is not particularly limited; however, it is, for example, preferably 900° C. or higher, more preferably 900° C. to 1,400° C., and still more preferably 1,000° C. to 1,200° C.

The firing time is not particularly limited; however, it is, for example, preferably 1 hour to 10 hours and more preferably 2 hours to 6 hours.

The pulverization unit is not particularly limited, as long as a targeted magnetoplumbite-type hexagonal ferrite powder having a desired particle size can be obtained.

Examples of the pulverization unit include a mortar and pestle, and a pulverizer (a cutter mill, a ball mill, a bead mill, a roller mill, a jet mill, a hammer mill, an attritor, or the like).

In the case of pulverizing using a medium, a particle size of the medium (so-called medium diameter) is not particularly limited; however, it is, for example, preferably 0.1 mm to 5.0 mm and more preferably 0.5 mm to 3.0 mm.

In the disclosure, in a case of a spherical medium (for example, spherical beads), the "medium diameter" means a diameter of a medium (for example, beads), and in a case of a non-spherical medium (for example, non-spherical beads), the "medium diameter" means a diameter obtained by measuring a circle equivalent diameter of a plurality of media (for example, beads) from an observation image of a transmission electron microscope (TEM) or a scanning electron microscope (SEM) and arithmetically averaging the measured values.

The material of the medium is not particularly limited, and for example, a medium formed of glass, alumina, steel, zirconia, ceramic, or the like can be preferably used.

[Radio Wave Absorber]

The radio wave absorber of the present disclosure contains the magnetoplumbite-type hexagonal ferrite powder of the present disclosure and a binder.

There is a correlation between the magnetic field strength Hα of the magnetoplumbite-type hexagonal ferrite powder of the present disclosure and the resonance frequency, and the resonance frequency can be controlled by adjusting the magnetic field strength Hα. As a result, since the radio wave absorber of the present disclosure contains the magnetoplumbite-type hexagonal ferrite powder of the present disclosure, the absorption of a radio wave of a desired frequency can be efficiently enhanced, and an excellent radio wave absorption performance can be exhibited.

The shape of the radio wave absorber of the present disclosure is not particularly limited and may be a planar shape, a three-dimensional shape, or a linear shape.

The planar shape thereof is not particularly limited, and examples thereof include a sheet shape and a film shape.

Examples of the three-dimensional shape include a polygonal column having a shape of a triangle or more, a column, a pyramid, a cone, a honeycomb, and the like. In addition, as the three-dimensional shape, a shape obtained by combining the above-described planar shape and the three-dimensional shape is also used.

The linear shape is not particularly limited, and examples thereof include a filament shape and a strand shape.

The radio wave absorption performance of the radio wave absorber of the present disclosure can be controlled not only by the content of the magnetoplumbite-type hexagonal ferrite powder of the present disclosure in the radio wave absorber but also by the shape of the radio wave absorber.

The radio wave absorber of the present disclosure may contain only one kind of the magnetoplumbite-type hexagonal ferrite powder of the present disclosure or may contain two or more kinds thereof.

The radio wave absorber of the present disclosure may contain, for example, two or more kinds of the magnetoplumbite-type hexagonal ferrite powders of the present disclosure, which have compositions different from each other.

The content of the magnetoplumbite-type hexagonal ferrite powder of the present disclosure in the radio wave absorber of the present disclosure is not particularly limited, and is, for example, preferably 10% by mass or more, more preferably 30% by mass or more, and still more preferably 50% by mass or more, with respect to a total solid content of the radio wave absorber, from the viewpoint of the radio wave absorption performance of the radio wave absorber.

In addition, the content of the magnetoplumbite-type hexagonal ferrite powder of the present disclosure in the radio wave absorber of the present disclosure is, for example, preferably 98% by mass or less, more preferably 95% by mass or less, and still more preferably 92% by mass or less, with respect to a total solid content of the radio wave absorber, from viewpoints of the hardness and the manufacturing suitability of the radio wave absorber.

In the disclosure, in a case where the radio wave absorber does not contain a solvent, the total solid content in the radio wave absorber means a total mass of the radio wave absorber, and in a case where the radio wave absorber contains a solvent, the total solid content in the radio wave absorber means a total mass excluding the solvent from the radio wave absorber.

The radio wave absorber of the present disclosure includes a binder.

Examples of the binder include a thermoplastic resin and a thermosetting resin.

Examples of the thermoplastic resin include an acrylic resin; polyacetal; polyamide; polyethylene; polypropylene; polyethylene terephthalate; polybutylene terephthalate; polycarbonate; polystyrene; polyphenylene sulfide; polyvinyl chloride; an acrylonitrile butadiene styrene (ABS) resin obtained by copolymerization of acrylonitrile, butadiene, and styrene; and an acrylonitrile styrene (AS) resin obtained by copolymerization of acrylonitrile and styrene.

Examples of the thermosetting resin include a phenol resin, an epoxy resin, a melamine resin, a urea resin, an unsaturated polyester, a diallyl phthalate resin, a urethane resin, and a silicon resin.

Examples of the binder include rubber.

From viewpoints that the mixability with the magnetoplumbite-type hexagonal ferrite powder of the present disclosure is good and the radio wave absorber having more excellent durability, weather fastness, and impact resistance can be produced, the rubber is preferably butadiene rubber; isoprene rubber; chloroprene rubber; halogenated butyl rubber; fluororubber; urethane rubber; acrylic rubber (ACM) obtained by copolymerization of acrylates (for example, ethyl acrylate, butyl acrylate, and 2-ethylhexyl acrylate) and other monomers; ethylene-propylene rubber obtained by coordination polymerization of ethylene and propylene using a Ziegler catalyst; butyl rubber (IIR) obtained by copolymerization of isobutylene and isoprene; styrene butadiene rubber (SBR) obtained by copolymerization of butadiene and styrene; acrylonitrile butadiene rubber (NBR) obtained by copolymerization of acrylonitrile and butadiene; and silicone rubber.

Examples of the binder include a thermoplastic elastomer (TPE).

Examples of the thermoplastic elastomer include an olefin-based thermoplastic elastomer (TPO), a styrene-based thermoplastic elastomer (TPS), an amide-based thermoplastic elastomer (TPA), and a polyester-based thermoplastic elastomer (TPC).

In a case where the radio wave absorber of the present disclosure contains rubber as the binder, it may contain various additives such as a vulcanizing agent, a vulcanization aid, a softener, and a plasticizer, in addition to the rubber.

Examples of the vulcanizing agent include sulfur, an organic sulfur compound, and a metal oxide.

The melt mass flow rate (hereinafter, also referred to as "MFR") of the binder is not particularly limited; however, it is, for example, preferably 1 g/10 min to 200 g/10 min, more preferably 3 g/10 min to 100 g/10 min, still more preferably 5 g/10 min to 80 g/10 min, and particularly preferably 10 g/10 min to 50 g/10 min.

In a case where the MFR of the binder is 1 g/10 min or more, fluidity is sufficiently high and the poor appearance is less likely to occur.

In a case where the MFR of the binder is 200 g/10 min or less, mechanical properties such as the hardness of a molded body are more easily enhanced.

The MFR of the binder is a value measured under the conditions of a measurement temperature of 230° C. and a load of 10 kg according to JIS K 7210:1999.

The hardness of the binder is not particularly limited; however, it is, for example, preferably 5 g to 150 g, more preferably 10 g to 120 g, still more preferably 30 g to 100 g, and particularly preferably 40 g to 90 g, from the viewpoint of moldability.

The hardness of the binder is an instantaneous value measured according to JIS K 6253-3:2012.

The density of the binder is not particularly limited; however, it is, for example, preferably 600 kg/m$^3$ to 1,100 kg/m$^3$, more preferably 700 kg/m$^3$ to 1,000 kg/m$^3$, still more preferably 750 kg/m$^3$ to 1,050 kg/m$^3$, and particularly preferably 800 kg/m$^3$ to 950 kg/m$^3$, from the viewpoint of moldability.

The density of the binder is a value measured according to JIS K 0061:2001.

The 100% tensile stress of the binder is not particularly limited; however, it is, for example, preferably 0.2 MPa to 20 MPa, more preferably 0.5 MPa to 10 MPa, still more preferably 1 MPa to 5 MPa, and particularly preferably 1.5 MPa to 3 MPa, from the viewpoint of moldability.

The tensile strength of the binder is not particularly limited; however, it is, for example, preferably 1 MPa to 20 MPa, more preferably 2 MPa to 15 MPa, still more preferably 3 MPa to 10 MPa, and particularly preferably 5 MPa to 8 MPa, from the viewpoint of moldability.

The elongation at the time of cutting of the binder is not particularly limited; however, it is, for example, preferably 110% to 1,500%, more preferably 150% to 1,000%, still more preferably 200% to 900%, and particularly preferably 400% to 800%, from the viewpoint of moldability.

The tensile properties described above are values measured according to JIS K 6251:2010. The measurement is carried out using a JIS No. 3 dumbbell as a test piece under the condition of a pulling speed of 500 mm/min.

The radio wave absorber of the present disclosure may include only one kind of binder and may include two or more kinds thereof.

The content of the binder in the radio wave absorber of the present disclosure is not particularly limited, and it is, for example, preferably 2% by mass or more, more preferably 5% by mass or more, and still more preferably 8% by mass or more, with respect to the total solid content of the radio wave absorber, from the viewpoints of the dispersibility of the magnetoplumbite-type hexagonal ferrite powder of the present disclosure and the manufacturing suitability and durability of the radio wave absorber.

In addition, the content of the binder in the radio wave absorber of the present disclosure is, for example, preferably 50% by mass or less, more preferably 40% by mass or less, and still more preferably 30% by mass or less, with respect to the total solid content of the radio wave absorber, from the viewpoint of the radio wave absorption performance of the radio wave absorber.

The radio wave absorber of the present disclosure may contain various additives (so-called other additives) as necessary, in addition to the magnetoplumbite-type hexagonal ferrite powder of the present disclosure and the binder, as long as the effects of the radio wave absorber of the present disclosure are not impaired.

Examples of the other additives include an antioxidant, a light stabilizer, a dispersing agent, a dispersing aid, a fungicide, an antistatic agent, a plasticizer, an impact resistance improver, a crystal nucleating agent, a lubricant, a surfactant, a pigment, a dye, a filler, a mold release agent (fatty acid, a fatty acid metal salt, an oxyfatty acid, a fatty acid ester, an aliphatic partially saponified ester, paraffin, a low molecular weight polyolefin, a fatty acid amide, an alkylenebis fatty acid amide, an aliphatic ketone, a fatty acid lower alcohol ester, a fatty acid polyhydric alcohol ester, a fatty acid polyglycol ester, a modified silicone, and the like), a processing aid, an antifogging agent, a drip inhibitor, and an antibacterial agent. One component of the other additives may perform more than two functions.

<Antioxidant>

The radio wave absorber of the present disclosure preferably contains an antioxidant.

The antioxidant is not particularly limited, and a known antioxidant can be used.

Examples of the antioxidant are described in, for example, "Comprehensive Technology for Polymer Stabilization— Mechanism and Application Development—" published by CMC Publishing Co., Ltd., supervised by Yasukazu Okatsu. This description is incorporated in the present specification by reference.

Examples of the kind of the antioxidant include a phenol-based antioxidant, an amine-based antioxidant, a phosphorus-based antioxidant, and a sulfur-based antioxidant.

As the antioxidant, it is preferable to use a phenol-based antioxidant and/or an amine-based antioxidant in combination with a phosphorus-based antioxidant and/or a sulfur-based antioxidant.

Examples of the phenol-based antioxidant include ADEKA STAB AO-20, ADEKA STAB AO-30, ADEKA STAB AO-40, ADEKA STAB AO-50, ADEKA STAB AO-60, ADEKA STAB AO-80, and ADEKA STAB AO-330, manufactured by ADEKA Corporation; and IRGANOX 1010, IRGANOX 1035, IRGANOX 1076, IRGANOX 1098, IRGANOX 1135, IRGANOX 1330, IRGANOX 1726, IRGANOX 245, IRGANOX 259, IRGANOX 3114, and IRGANOX 565, manufactured by BASF Japan Ltd. The above "ADEKA STAB" and "IRGANOX" are both registered trade marks.

Examples of the amine-based antioxidants include Sanol LS-770, Sanol LS-765, and Sanol LS-2626, manufactured by Mitsubishi-Chemical Foods Corporation; ADEKA STAB LA-77, ADEKA STAB LA-57, ADEKA STAB LA-52, ADEKA STAB LA-62, ADEKA STAB LA-63, ADEKA STAB LA-67, ADEKA STAB LA-68, and ADEKA STAB LA-72, manufactured by ADEKA Corporation; and TINUVIN 123, TINUVIN 144, TINUVIN 622, TINUVIN 765, and TINUVIN 944, manufactured by BASF Japan Ltd. The above "ADEKA STAB" and "TINUVIN" are both registered trade marks.

Further, in the radio wave absorber of the present disclosure, an amine-based compound capable of quenching radicals can also be used as the antioxidant. Examples of such an amine-based compound include polyethylene glycol bis TEMPO [Sigma-Aldrich Co., LLC] and sebacic acid bis TEMPO. Here, "TEMPO" is an abbreviation for tetramethylpiperidin-1-oxyl.

Examples of the phosphorus-based antioxidant include ADEKA STAB PEP-8, ADEKA STAB PEP-36, ADEKA STAB HP-10, and ADEKA STAB 2112, manufactured by ADEKA Corporation; and IRGAFOS 168 manufactured by BASF Japan Ltd. The above "ADEKA STAB" and "IRGAFOS" are both registered trade marks.

Examples of the sulfur-based antioxidant include ADEKA STAB AO-412S and ADEKA STAB AO-503S, manufactured by ADEKA Corporation. The above "ADEKA STAB" is a registered trade mark.

Among the above, the phenol-based antioxidant is preferably at least one selected from the group consisting of ADEKA STAB AO-20, ADEKA STAB AO-60, ADEKA STAB AO-80, and IRGANOX 1010, the amine-based antioxidant is preferably ADEKA STAB LA-52, the phosphorus-based antioxidant is preferably ADEKA STAB PEP-36, and the sulfur-based antioxidant is preferably ADEKA STAB AO-412S.

In a case of containing an antioxidant, the radio wave absorber of the present disclosure may contain only one kind of antioxidant or may contain two or more kinds of antioxidants.

In a case where the radio wave absorber of the present disclosure contains an antioxidant, the content of the antioxidant in the radio wave absorber is not particularly limited; however, it is, for example, preferably 0.1 parts by mass to 10 parts by mass and more preferably 0.5 parts by mass to 5 parts by mass with respect to 100 parts by mass of the binder from the viewpoint of both suppressing the decomposition of the binder and suppressing the bleeding of the antioxidant.

<Light Stabilizer>

The radio wave absorber of the present disclosure preferably contains a light stabilizer.

Examples of the light stabilizer include HALS (that is, a hindered amine-based light stabilizer), an ultraviolet absorber, and a singlet oxygen quencher.

The HALS may be a high molecular weight HALS, a low molecular weight HALS, or a combination of a high molecular weight HALS and a low molecular weight HALS.

In a case of containing a light stabilizer, the radio wave absorber of the present disclosure may contain only one kind of light stabilizer or may contain two or more kinds of light stabilizers.

—High Molecular Weight HALS—

In the present disclosure, the "high molecular weight HALS" means a hindered amine-based light stabilizer having a weight-average molecular weight of more than 1,000.

Examples of the high molecular weight HALS include, as an oligomer-type HALS, poly [6-(1,1,3,3-tetramethylbutyl) imino-1,3,5-triazine-2,4-diyl][(2,2,6,6-tetramethyl-4-piperidyl)imino]hexamethylene [(2,2,6,6-tetramethyl-4-piperidyl)imino] and dimethyl succinate-1-(2-hydroxyethyl)-4-hydroxy-2,2,6,6-tetramethylpiperidine poly condensate.

Examples of the commercially available high molecular weight HALS product include CHIMASSORB 944LD and TINUVIN 622LD, manufactured by BASF Japan Ltd. The above "CHIMASSORB" and "TINUVIN" are both registered trade marks.

The weight-average molecular weight (Mw) in the present disclosure is a value measured by gel permeation chromatography (GPC). For the measurement by the gel permeation chromatography (GPC), HLC (registered trade mark)-8220GPC [manufactured by Tosoh Corporation] is used as the measurement device, TSKgel (registered trade mark) Super HZM-M [4.6 mm ID×15 cm, manufactured by Tosoh Corporation], Super HZ4000 [4.6 mm ID×15 cm, manufactured by Tosoh Corporation], Super HZ3000 [4.6 mm ID×15 cm, manufactured by Tosoh Corporation], and Super HZ2000 [4.6 mm ID×15 cm, Tosoh Corporation] are connected one by one in series and used as the column, and tetrahydrofuran (THF) can be used as the eluent.

The measurement conditions are a sample concentration of 0.2% by mass, a flow rate of 0.35 mL/min, a sample injection amount of 10 μL, a measurement temperature of 40° C., and the detection is carried out using a differential refractive index (RI) detector.

The calibration curve can be created using "Standard sample TSK standard, polystyrene": "F-40", "F-20", "F-4", "F-1", "A-5000", "A-2500", and "A-1000", manufactured by Tosoh Corporation.

In a case where the radio wave absorber of the present disclosure contains a high molecular weight HALS, the content of the high molecular weight HALS in the radio wave absorber is not particularly limited; however, it is, for example, preferably 0.2% by mass to 10% by mass with respect to the total mass of the radio wave absorber.

In a case where the content of the high molecular weight HALS in the radio wave absorber of the present disclosure is 0.2% by mass or more with respect to the total mass of the radio wave absorber, the targeted weather fastness can be more sufficiently obtained.

In a case where the content of the high molecular weight HALS in the radio wave absorber of the present disclosure is 10% by mass or less with respect to the total mass of the radio wave absorber, the decrease in mechanical strength and the occurrence of blooming tend to be further suppressed.

—Low Molecular Weight HALS—

In the present disclosure, the "low molecular weight HALS" means a hindered amine-based light stabilizer having a molecular weight of 1,000 or less (preferably 900 or less and more preferably 600 to 900).

Examples of the low molecular weight HALS include tris(2,2,6,6-tetramethyl-4-piperidyl)benzene-1,3,5-tricarboxylate, tris(2,2,6,6-tetramethyl-4-piperidyl)-2-acetoxypropane-1,2,3-tricarboxylate, tris(2,2,6,6-tetramethyl-4-piperidyl)-2-hydroxypropane-1,2,3-tricarboxylate, tris(2,2,6,6-tetramethyl-4-piperidyl)triazine-2,4,6-tricarboxylate, tris(2,2,6,6-tetramethyl-4-piperidyl)butane-1,2,3-tricarboxylate, tetrakis(2,2,6,6-tetramethyl-4-piperidyl)propane-1,1,2,3-tetracarboxylate, tetrakis(2,2,6,6-tetramethyl-4-piperidyl) 1,2,3,4-butanetetracarboxylate, tetrakis(1,2,2,6,6-pentamethyl-4-piperidyl) 1,2,3,4-butanetetracarboxylate, and 2-(3,5-di-t-butyl-4-hydroxybenzyl)-2-n-butylmalonate bis(1,2,2,6,6-pentamethyl-4-piperidyl).

Examples of the commercially available low molecular weight HALS product include ADEKA STAB LA-57, and ADEKA STAB LA-52, manufactured by ADEKA Corporation; and TINUVIN 144 manufactured by BASF Japan Ltd. The above "ADEKA STAB" and "TINUVIN" are both registered trade marks.

In a case where the radio wave absorber of the present disclosure contains a low molecular weight HALS, the content of the low molecular weight HALS in the radio wave absorber is not particularly limited; however, it is, for example, preferably 0.2% by mass to 10% by mass with respect to the total mass of the radio wave absorber.

In a case where the content of the low molecular weight HALS in the radio wave absorber of the present disclosure is 0.2% by mass or more with respect to the total mass of the radio wave absorber, the targeted weather fastness can be more sufficiently obtained.

In a case where the content of the low molecular weight HALS in the radio wave absorber of the present disclosure is 10% by mass or less with respect to the total mass of the radio wave absorber, the decrease in mechanical strength and the occurrence of blooming tend to be further suppressed.

—Ultraviolet Absorber—

Examples of the ultraviolet absorber include benzotriazole-based ultraviolet absorbers such as 2-(2'-hydroxy-3',5'-di-t-butylphenyl)benzotriazole, 2-(3,5-di-t-amyl-2-hydroxyphenyl)benzotriazole, 2-(2'-hydroxy-5'-methyl-phenyl)benzotriazole, 2-(2'-hydroxy-5'-t-octylphenyl)benzotriazole, 2-(2'-hydroxy-3',5'-di-t-amylphenyl)benzotriazole, 2-[2'-hydroxy-3'-(3",4",5",6"-tetrahydrophthalimidemethyl)-5'-methylphenyl]benzotriazole, 2,2'-methylenebis[4-(1,1,3,3-tetramethylbutyl)-6-(2H-benzotriazole-2-yl)phenol], 2-[2-hydroxy-3,5-bis(α,α-dimethylbenzyl)phenyl]-2H-benzotriazole, 2-(2-hydroxy-4-octyloxyphenyl)-2H-benzotriazole, and 2-(2H-benzotriazole-2-yl)-4-methyl-6-(3,4,5,6-tetrahydrophthalimidylmethyl)phenol; benzophenone-based ultraviolet absorbers such as 2-hydroxy-4-methoxybenzophenone, 2,4-dihydroxybenzophenone, 2,2'-dihydroxy-4-methoxybenzophenone, 2,2'-dihydroxy-4,4'-dimethoxybenzophenone 2-hydroxy-4-n-octoxybenzophenone, 2,2',4,4'-tetrahydroxybenzophenone, 4-dodecyloxy-2-hydroxybenzophenone, a 3,5-di-t-butyl-4-(hydroxybenzoyl)benzoic acid n-hexadecyl ester, 1,4-bis(4-benzoyl-3-hydroxyphenoxy)butane 1,6-bis(4-benzoyl-3-hydroxyphenoxy)hexane; and cyanoacrylate-based ultraviolet absorbers represented by ethyl-2-cyano-3,3-diphenylacrylate.

Examples of the commercially available ultraviolet absorbers include TINUVIN 320, TINUVIN 328, TINUVIN 234, TINUVIN 1577, TINUVIN 622, and IRGANOX series, manufactured by BASF Japan Ltd.; ADEKA STAB LA31 manufactured by ADEKA Corporation; and SEESORB 102, SEESORB 103, and SEESORB 501, manufactured by SHIPRO KASEI KAISHA, Ltd. The above-described "TINUVIN", "IRGANOX", "ADEKA STAB", and "SEESORB" are all registered trade marks.

In a case where the radio wave absorber of the present disclosure contains an ultraviolet absorber, the content of the ultraviolet absorber in the radio wave absorber is not particularly limited; however, it is, for example, preferably 0.2% by mass to 10% by mass with respect to the total mass of the radio wave absorber.

In a case where the content of the ultraviolet absorber in the radio wave absorber of the present disclosure is 0.2% by mass or more with respect to the total mass of the radio wave absorber, the targeted weather fastness can be more sufficiently obtained.

In a case where the content of the ultraviolet absorber in the radio wave absorber of the present disclosure is 10% by mass or less with respect to the total mass of the radio wave absorber, the decrease in mechanical strength and the occurrence of blooming tend to be further suppressed.

—Singlet Oxygen Quencher—

In a case where the radio wave absorber of the present disclosure contains a singlet oxygen quencher, the content of the singlet oxygen quencher in the radio wave absorber is not particularly limited; however, it is, for example, preferably 0.2% by mass to 10% by mass with respect to the total mass of the radio wave absorber.

In a case where the content of the singlet oxygen quencher in the radio wave absorber of the present disclosure is 0.2% by mass or more with respect to the total mass of the radio wave absorber, the targeted weather fastness can be more sufficiently obtained.

In a case where the content of the singlet oxygen quencher in the radio wave absorber of the present disclosure is 10% by mass or less with respect to the total mass of the radio wave absorber, the decrease in mechanical strength and the occurrence of blooming tend to be further suppressed.

In a case of containing a light stabilizer, the radio wave absorber of the present disclosure may contain only one kind of light stabilizer or may contain two or more kinds of light stabilizers.

The fact that the radio wave absorber contains the powder of the specific magnetoplumbite-type hexagonal ferrite can be confirmed, for example, by the following method.

After the radio wave absorber is finely chopped, it is immersed in a solvent (for example, acetone) for 1 or 2 days, and then dried. The structure can be confirmed by further finely grinding the dried radio wave absorber and carrying out the powder X-ray diffraction (XRD) measurement.

After cutting out the cross section of the radio wave absorber, the composition can be confirmed by using, for example, an energy dispersive X-ray analyzer.

Whether or not the radio wave absorber contains a powder of a specific compound can be confirmed by, for example, the following method.

After the radio wave absorber is finely chopped, it is immersed in a solvent (for example, acetone) for 1 or 2 days, and then dried. Next, the dried radio wave absorber is further ground finely and is subjected to the powder X-ray diffraction (XRD) measurement. The powder X-ray diffraction (XRD) measurement is carried out using the powder X-ray diffractometer under the following conditions. Then, the presence or absence of the specific compound can be confirmed by the presence or absence of the peak derived from the specific compound.

—Conditions—

X-ray source: CuKα ray
[Wavelength: 1.54 Å (0.154 nm), output: 40 mA, 45 kV]
Scan range: $20° < 2\theta < 70°$
Scan interval: $0.05°$
Scan speed: $0.33°$/min In a case where the content of the specific compound contained in the radio wave absorber is extremely small, although it is difficult to detect a specific compound by the powder X-ray diffraction (XRD) measurement, the specific compound can be confirmed by, for example, the following method.

After cutting out a cross section of the radio wave absorber, the cross section is observed at an acceleration voltage of 5 kV using an energy dispersive X-ray analyzer, and elemental mapping of $A^a$, Fe, Al, and O in Formula (2) is carried out, whereby the presence or absence of the specific compound can be confirmed.

[Method of Producing Radio Wave Absorber]

The method of producing the radio wave absorber of the present disclosure is not particularly limited.

The radio wave absorber of the disclosure can be produced by a well known method using the magnetoplumbite-type hexagonal ferrite powder of the present disclosure, a binder, and, as necessary, a solvent, other additives, and the like.

The radio wave absorber of the present disclosure can be produced by, for example, the following method.

A composition for forming a radio wave absorber, containing the magnetoplumbite-type hexagonal ferrite powder of the present disclosure, a binder, and, as necessary, a solvent, other additives, and the like is applied onto a support to form a coating film of the composition for forming a radio wave absorber. Next, the formed coating film of the composition for forming a radio wave absorber is dried to produce a radio wave absorber.

The magnetoplumbite-type hexagonal ferrite powder of the present disclosure is as described above, and thus the description thereof is omitted here.

The content of the magnetoplumbite-type hexagonal ferrite powder of the present disclosure in the composition for forming a radio wave absorber is not particularly limited, and for example, the content in the finally obtained radio wave absorber may be adjusted to become the content of the radio wave absorber described above.

Since the binder in the method of producing a radio wave absorber of the present disclosure has the same meaning as the binder described in the section of "Radio wave absorber", and the preferred aspect is also the same, the description thereof is omitted here.

The content of the binder in the composition for forming a radio wave absorber is not particularly limited, and for example, the content in the finally obtained radio wave absorber may be adjusted to become the content of the radio wave absorber described above.

Since the other additives in the method of producing a radio wave absorber of the present disclosure has the same meaning as the other additives described in the section of "Radio wave absorber", and the preferred aspect is also the same, the description thereof is omitted here.

In a case where the composition for forming a radio wave absorber contains a solvent, the solvent is not particularly limited, and examples thereof include water, an organic solvent, and a mixed solvent of water and an organic solvent.

Examples of the organic solvent include alcohols such as methanol, ethanol, n-propanol, i-propanol, and methoxypropanol, ketones such as acetone, methyl ethyl ketone, cyclohexane, and cyclohexanone, tetrahydrofuran, acetonitrile, ethyl acetate, and toluene.

Among these, the solvent is preferably cyclohexanone from the viewpoint of a suitable drying rate.

In a case where the composition for forming a radio wave absorber includes a solvent, the content of the solvent in the composition for forming a radio wave absorber is not particularly limited, and it can be suitably set, for example, depending on the kind or amount of the components blended in the composition for forming a radio wave absorber.

The content of the solvent in the composition for forming a radio wave absorber is appropriately set depending on whether the composition for forming a radio wave absorber is applied or subjected to mold processing as described later.

In the composition for forming a radio wave absorber, the magnetoplumbite-type hexagonal ferrite powder of the present disclosure and the binder may be simply mixed.

The method of mixing the magnetoplumbite-type hexagonal ferrite powder of the present disclosure and the binder is not particularly limited, and examples thereof include a method of mixing by stirring.

A stirring unit is not particularly limited, and a general stirring device can be used.

As the stirring device, a mixer such as a paddle mixer or an impeller mixer is used.

The stirring time is not particularly limited, and for example, can be suitably set depending on the kind of the stirring device or the composition of the composition for forming a radio wave absorber.

The support is not particularly limited, and a well known support can be used.

Examples of the material configuring the support include a metal plate (a plate of metal such as aluminum, zinc, or copper), a glass plate, a plastic sheet [a sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which the metal described above is laminated or vapor-deposited.

The plastic sheet is preferably biaxially stretched.

The support can function to maintain the form of the radio wave absorber.

In a case where the formed radio wave absorber can maintain the form thereof, the support may be removed from the radio wave absorber after producing the radio wave absorber, using a glass plate, a metal plate, or a plastic sheet having a surface subjected to a release treatment.

The shape, the structure, or the size of the support can be appropriately selected depending on the intended purpose.

The shape of the support is, for example, a flat plate shape.

The structure of the support may be a single-layered structure or a laminated structure of two or more layers.

The size of the support can be appropriately selected according to the size of the radio wave absorber and the like.

The thickness of the support is not particularly limited, and is normally approximately 0.01 mm to 10 mm, for example, preferably 0.02 mm to 3 mm and more preferably 0.05 mm to 1 mm, from the viewpoint of handleability.

The method of applying the composition for a radio wave absorber on a support is not particularly limited, and examples thereof include methods using a die coater, a knife coater, an applicator, and the like.

The method of drying the coating film of the composition for forming a radio wave absorber is not particularly limited, and examples thereof include a method using a heating device such as an oven.

The drying temperature and drying time are not particularly limited as long as the solvent contained in the coating film of the composition for forming a radio wave absorber can be volatilized.

For example, heating is carried out at 70° C. to 90° C. for 1 hour to 3 hours.

Further, the radio wave absorber of the present disclosure can be produced by, for example, the following method.

A composition for forming a radio wave absorber containing a specific magnetoplumbite-type hexagonal ferrite powder, a binder, and, as necessary, a solvent, other additives, and the like is kneaded using a kneader while heating, whereby a kneaded material is obtained. Next, the obtained kneaded material is subjected to mold processing into a planar shape or a three-dimensional shape, whereby a radio wave absorber is produced.

Examples of the mold processing include processing by press molding, extrusion molding, injection molding, in-mold forming, and the like.

The radio wave absorber of the present disclosure may be produced by, for example, the following method.

A composition for forming a radio wave absorber containing a specific magnetoplumbite-type hexagonal ferrite powder, a binder, and, as necessary, a solvent, other additives, and the like is subjected to a mold processing into a pellet shape, and then the obtained molded body having a pellet shape may be used as a raw material to produce a radio wave absorber having a planar shape, a three-dimensional shape, or a linear shape.

The molded body having a pellet shape may contain a coloring agent such as carbon black, an additive for the intended purpose of improving the antistatic properties or the weather fastness, and the like.

The size (the so-called diameter) of the molded body having a pellet shape is not particularly limited; however, it is, for example, preferably 0.5 mm to 20 mm, more preferably 1 mm to 10 mm, still more preferably 2 mm to 8 mm, and particularly preferably 3 mm to 6 mm.

The density of the molded body having a pellet shape is not particularly limited; however, it is, for example, preferably 500 kg/m$^3$ to 5,000 kg/m$^3$, more preferably 800 kg/m$^3$ to 4,000 kg/m$^3$, still more preferably 1,000 kg/m$^3$ to 3,500 kg/m$^3$, and particularly preferably 1,200 kg/m$^3$ to 3,000 kg/m$^3$.

The above density is a value measured according to JIS K 0061: 2001.

[Method of Controlling Resonance Frequency of Magnetoplumbite-Type Hexagonal Ferrite Powder]

The control method of the present disclosure is a method of controlling a resonance frequency of a magnetoplumbite-type hexagonal ferrite powder by adjusting a magnetic field strength Hα which corresponds to 90% of a magnetization quantity obtained in a case where an external magnetic field of 50 kOe is applied to a magnetoplumbite-type hexagonal ferrite powder containing a powder of a magnetoplumbite-type hexagonal ferrite represented by Formula (1), within a range satisfying 19 kOe≤Hα≤28 kOe.

According to the control method of the present disclosure, the resonance frequency of the magnetoplumbite-type hexagonal ferrite powder can be satisfactorily controlled in the frequency band of 60 GHz to 90 GHz even in a case where a specific compound is contained.

Since the powder of the magnetoplumbite-type hexagonal ferrite represented by Formula (1) in the control method of the present disclosure is the same as the powder of the magnetoplumbite-type hexagonal ferrite (that is, the specific magnetoplumbite-type hexagonal ferrite) represented by Formula (1) described in the section of "Magnetoplumbite-type hexagonal ferrite powder", and the preferred aspect is also the same, the description thereof is omitted here.

In addition, since the magnetic field strength Hα is the same as the magnetic field strength Hα described in the section of "Magnetoplumbite-type hexagonal ferrite powder", and the preferred aspect is also the same, the description thereof is omitted here.

The content of the powder of the magnetoplumbite-type hexagonal ferrite represented by Formula (1) in the magnetoplumbite-type hexagonal ferrite powder is not particularly limited; however, it is, for example, preferably 80% by mass or more, more preferably 90% by mass or more, and still more preferably 95% by mass or more, with respect to the total mass of the magnetoplumbite-type hexagonal ferrite powder.

The upper limit of the content of the powder of the magnetoplumbite-type hexagonal ferrite represented by Formula (1) in the magnetoplumbite-type hexagonal ferrite powder is not particularly limited, and for example, 99% by mass or less with respect to the total mass of the magnetoplumbite-type hexagonal ferrite powder is mentioned.

The method of adjusting the magnetic field strength Hα is not particularly limited.

The magnetic field strength Hα can be adjusted by changing, for example, the kind of the raw material, the particle size of the raw material, the amount of the raw material to be used, the method of mixing the raw material, and the like of the magnetoplumbite-type hexagonal ferrite powder.

Specifically, for example, the value of the magnetic field strength Hα can be increased by increasing the formulation ratio of the inorganic compound containing Al to the inorganic compound containing Fe, which is used as a raw material. Further, for example, the value of the magnetic field strength Hα can be increased by reducing the particle size of the inorganic compound containing Al, which is used as a raw material.

In the control method of the present disclosure, the magnetoplumbite-type hexagonal ferrite powder may contain a compound represented by Formula (2).

The control method of the present disclosure can satisfactorily control the resonance frequency of the magnetoplumbite-type hexagonal ferrite powder in the frequency band of 60 GHz to 90 GHz even in a case where the compound represented by Formula (2) is contained.

Since the powder of the compound represented by Formula (2) in the control method of the present disclosure is the same as the powder of the compound (that is, the specific compound) represented by Formula (2) described in the section of "Magnetoplumbite-type hexagonal ferrite powder", and the preferred aspect is also the same, the description thereof is omitted here.

The content of the compound represented by Formula (2) in the magnetoplumbite-type hexagonal ferrite powder is not particularly limited; however, it is, for example, preferably 20% by mass or less, more preferably 10% by mass or less, and still more preferably 5% by mass or less, with respect to the total mass of the magnetoplumbite-type hexagonal ferrite powder.

The lower limit of the content of the compound represented by Formula (2) in the magnetoplumbite-type hexagonal ferrite powder is not particularly limited, and is, for example, 1% by mass or more with respect to the total mass of the magnetoplumbite-type hexagonal ferrite powder is mentioned.

According to the control method of the present disclosure, the resonance frequency of the magnetoplumbite-type hexagonal ferrite powder can be satisfactorily controlled in the frequency band of 60 GHz to 90 GHz even in a case where 10% by mass or more of the compound represented by Formula (2) is contained with respect to the total mass of the magnetoplumbite-type hexagonal ferrite powder.

EXAMPLES

Hereinafter, the present invention will be described in detail with reference to examples, but the present invention is not limited to the following examples, within a range not departing the gist thereof.

[Production of Magnetoplumbite-Type Hexagonal Ferrite Powder: Liquid Phase Method (Small Scale)]
[Powder A1]

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$AlCl_3 \cdot 6H_2O$] in 216.0 g of water, and a total amount of a solution prepared by adding 113.0 g of water to 181.3 g of a 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 24.7 g of a 1 mol/L sodium hydroxide aqueous solution was added while maintaining the temperature to obtain a second solution. The pH of the second solution was 9.0. The pH of the second solution was measured using a desktop pH meter #F-71 (product name) manufactured by Horiba, Ltd.

Next, the second solution was stirred for 15 minutes to complete the reaction, and a solution containing a reaction product which is a precursor of the magnetoplumbite-type hexagonal ferrite powder (that is, a precursor-containing solution) was obtained.

Next, the precursor-containing solution was subjected to the centrifugal separation treatment [rotation speed: 3,000 revolutions per minute (rpm); the same applies hereinafter), rotation time: 10 minutes] three times, and the obtained precipitate was collected.

Next, the collected precipitate was dried in an oven at an internal ambient temperature of 80° C. for 12 hours to obtain an aggregate of particles consisting of the precursor (that is, precursor powder).

Next, the powder of the precursor was put in a muffle furnace, and the temperature in the furnace was set to a temperature condition of 1,100° C. in the atmosphere, followed by firing for 4 hours, thereby obtaining a powder A1.

[Powder A2 to Powder A7]

The same operation as in the production of the powder A1 was carried out except that the pH of the second liquid was adjusted to the pH indicated in Table 1, thereby obtaining a powder A2 to a powder A7.

TABLE 1

| | Powder A1 | Powder A2 | Powder A3 | Powder A4 | Powder A5 | Powder A6 | Powder A7 |
|---|---|---|---|---|---|---|---|
| pH of second liquid | 9.0 | 9.5 | 10.0 | 10.5 | 11.0 | 11.5 | 12.0 |

[Powder A8]

The powder A5 was subjected to a surface treatment to produce a powder A8. Specifically, the following operations were carried out.

20 g of the powder A5 and 0.2 g of N-2-(aminoethyl)-3-aminopropyltrimethoxysilane [product name: KBM-603, a silane coupling agent, Shin-Etsu Chemical Co., Ltd.] were mixed for 60 seconds using Wonder Crusher WC-3 (product name) manufactured by OSAKA CHEMICAL Co., Ltd., with the variable speed dial being set to "3". Next, the obtained powder was placed in an oven at a set temperature of 90° C. and dried for 3 hours to obtain a powder A8.

[Production of Magnetoplumbite-Type Hexagonal Ferrite Powder: Solid Phase Method (Large Scale)]
[Powder B1]

30 g of strontium carbonate [$SrCO_3$], 147 g of α-iron (III) oxide [$\alpha\text{-}Fe_2O_3$], and 24.9 g of aluminum oxide [$Al_2O_3$] were sufficiently mixed using an EIRICH intensive mixer (model type: EL1, manufactured by EIRICH) at 1,000 rpm for 30 minutes to obtain a raw material mixture.

Next, the obtained raw material mixture was subjected to the pulverization treatment for 60 seconds using Wonder Crusher WC-3 (product name) manufactured by Osaka Chemical Co., Ltd., with the variable speed dial being set to "3", thereby obtaining a powder. The obtained powder was put in a muffle furnace, and the temperature in the furnace was set to a temperature condition of 1,100° C. in the atmosphere, followed by firing for 4 hours, thereby obtaining a powder B1.

[Powder B2 to Powder B6]

The same operations as in the production of the powder B1 were carried out except that the amount of the raw material to be used was changed as indicated in Table 2, whereby a powder B2 to a powder B6 were obtained.

TABLE 2

| | Amount of raw material to be used (g) | | |
|---|---|---|---|
| | $SrCO_3$ | $Fe_2O_3$ | $Al_2O_3$ |
| Powder B1 | 30 | 147 | 24.9 |
| Powder B2 | 30 | 150 | 23.4 |
| Powder B3 | 30 | 153 | 22.5 |
| Powder B4 | 30 | 159 | 21.3 |
| Powder B5 | 30 | 162 | 20.7 |
| Powder B6 | 30 | 165 | 18.9 |

[Production of Radio Wave Absorber]
[Radio Wave Absorber A1]

9.0 g of the powder A1, 1.05 g of acrylonitrile butadiene rubber (NBR) (grade: JSR N215SL, JSR Corporation, binder), and 6.1 g of cyclohexanone (a solvent) were stirred and mixed with a stirring device [product name: Awatori Neritaro ARE-310, Shinky Co., Ltd.], at a rotation speed of 2,000 rpm for 5 minutes to prepare a composition for forming a radio wave absorber.

Next, the prepared composition for forming a radio wave absorber was applied onto a glass plate (a support) using an applicator to form a coating film of the composition for forming a radio wave absorber.

Next, the formed coating film of the composition for forming a radio wave absorber was dried in an oven at an internal ambient temperature of 80° C. for 2 hours to form a radio wave absorption layer on the glass plate.

Next, the radio wave absorption layer was peeled off from the glass plate, and the peeled radio wave absorption layer was used as a radio wave absorber A1 (shape: a sheet shape, thickness: 0.3 mm).

[Radio Wave Absorber A2 to Radio Wave Absorber A8]

The same operations as in the production of the radio wave absorber A1 were carried out except that each powder of the powder A2 to the powder A8 were used instead of the powder A1, and each radio wave absorber of a radio wave absorber A2 to a radio wave absorber A8 were obtained.

All the radio wave absorbers of the radio wave absorber A2 to the radio wave absorber A8 had a sheet shape and had a thickness of 0.3 mm.

[Radio Wave Absorber B1 to Radio Wave Absorber B6]

The same operations as in the production of the radio wave absorber A1 were carried out except that each powder of the powder B1 to the powder B6 were used instead of the powder A1, and each of a radio wave absorber B1 to a radio wave absorber B6 were obtained.

All the radio wave absorbers of the radio wave absorber B1 to the radio wave absorber B6 had a sheet shape and had a thickness of 0.3 mm.

<Confirmation of Presence or Absence of Specific Compound and Composition>

Whether or not each powder of the powder A1 to the powder A8 and the powder B1 to the powder B6 contains a specific compound, and the composition of the specific compound in a case of being contained were confirmed by the X-ray diffraction (XRD) method.

Specifically, the confirmation was carried out by the following method.

The powder X-ray diffraction (XRD) measurement of each of the powders was carried out using a powder X-ray diffractometer (product name: X'Pert Pro, PANalytical) under the following measurement conditions. Then, the presence or absence of the peak derived from the specific compound and the composition thereof were confirmed.

—Measurement Conditions—

X-ray source: CuKα ray
[Wavelength: 1.54 Å (0.154 nm), output: 40 mA, 45 kV]
Scan range: 20°<2θ<70°
Scan interval: 0.05°
Scan speed: 0.33°/min As a result of the measurement, in the powder A1 to the powder A8, no peak derived from the specific compound was confirmed, and thus it has been confirmed that the specific compound is not contained.

On the other hand, in the powder B1 to the powder B6, peaks derived from the specific compound were confirmed, and thus it has been confirmed that the specific compound $SrAl_2O_4$ is contained.

<Confirmation of Crystal Structure>

The crystal structure of the magnetic material forming each powder of the powder A1 to the powder A8 and the powder B1 to the powder B6 (hereinafter, each also referred to as the "magnetic material A1 to magnetic material A8 and magnetic material B1 to magnetic material B6") was confirmed by the X-ray diffraction (XRD) method.

Specifically, the confirmation was carried out by the following method.

The powder X-ray diffraction (XRD) measurement of each of the powders was carried out using a powder X-ray diffractometer (product name: X'Pert Pro, PANalytical) under the following measurement conditions.

—Measurement Conditions—

X-ray source: CuKα ray
[Wavelength: 1.54 Å (0.154 nm), output: 40 mA, 45 kV]
Scan range: 20°<2θ<70°
Scan interval: 0.05°
Scan speed: 0.75°/min As a result of the measurement, it was confirmed that all of the magnetic material A1 to the magnetic material A8 and the magnetic material B1 to the magnetic material B6 have a magnetoplumbite-type crystal structure.

<Confirmation of Composition>

(1) Powder A1 to powder A8

The composition of each powder of the powder A1 to the powder A8 was confirmed by the high frequency inductively coupled plasma (ICP) emission spectroscopy.

Specifically, the confirmation was carried out by the following method.

A beaker containing 12 mg of the powder and 10 mL of a 4 mol/L hydrochloric acid aqueous solution was held in an oven at a set temperature of 120° C. for 12 hours to obtain a dissolution solution. 30 mL of pure water was added to the obtained dissolution solution, which is then filtered using a 0.1 μm membrane filter. Elemental analysis of the filtrate obtained as described above was carried out using a high frequency inductively coupled plasma (ICP) emission spectrometer [model number: ICPS-8100, Shimadzu Corporation].

Based on the obtained elemental analysis results, a content of each metal atom with respect to 100 atom % of iron atoms was obtained. Then, based on the obtained content, the composition of the powder was confirmed. The composition of each powder is shown below.

(Powder Composition)
Powder A1: $SrFe_{(9.65)}Al_{(2.35)}O_{19}$
Powder A2: $SrFe_{(9.72)}Al_{(2.28)}O_{19}$
Powder A3: $SrFe_{(9.79)}Al_{(2.21)}O_{19}$
Powder A4: $SrFe_{(9.86)}Al_{(2.14)}O_{19}$
Powder A5: $SrFe_{(10.00)}Al_{(2.00)}O_{19}$
Powder A6: $SrFe_{(10.13)}Al_{(1.87)}O_{19}$
Powder A7: $SrFe_{(0.20)}Al_{(1.80)}O_{19}$
Powder A8: $SrFe_{(10.00)}Al_{(2.00)}O_{19}$ Table 3 shows the ratio x' (hereinafter, also referred to as "Ax'") of aluminum atoms to 100 atom % of iron atoms in each powder of the powder A1 to the powder A8.

Since each powder of the powder A1 to the powder A8 did not contain a specific compound, any ratio x' (that is, Ax') of aluminum atoms to 100 atom % of iron atoms in each powder was the same value as x in Formula (1).

It was confirmed that each powder of the powder A1 to the powder A8 is a powder of the specific magnetoplumbite-type hexagonal ferrite.

(2) Powder B1 to Powder B6

The composition of each powder of the powder B1 to the powder B6 was confirmed by the high frequency inductively coupled plasma (ICP) emission spectroscopy.

Specifically, the confirmation was carried out by the following method.

A beaker containing 12 mg of the powder and 10 mL of a 4 mol/L hydrochloric acid aqueous solution was held in an oven at a set temperature of 120° C. for 12 hours to obtain a dissolution solution. 30 mL of pure water was added to the obtained dissolution solution, which is then filtered using a 0.1 μm membrane filter. Elemental analysis of the filtrate obtained as described above was carried out using a high frequency inductively coupled plasma (ICP) emission spectrometer [model number: ICPS-8100, Shimadzu Corporation].

Based on the obtained elemental analysis results, a content of each metal atom with respect to 100 atom % of iron atoms was obtained. Then, based on the obtained content, the ratio x' of aluminum atoms to 100 atom % of iron atoms (hereinafter, also referred to as "Bx'") was determined.

Next, the resonance frequency (hereinafter, also referred to as the "resonance frequency B") corresponding to the value of Bx' was determined from the approximate straight line [that is, an approximated straight line based on the value of the ratio x' of aluminum atoms to 100 atom % of iron atoms in each powder of the powder B1 to the powder B6 (hereinafter, also collectively referred to as the "powder B")] of the solid phase method shown in FIG. 1.

Next, the value of Ax' corresponding to the resonance frequency B was determined from the approximate straight line [that is, an approximated straight line based on the value of the ratio x' of aluminum atoms to 100 atom % of iron atoms in each powder of the powder A1 to the powder A7 (hereinafter, also collectively referred to as the "powder A")] of the liquid phase method shown in FIG. 1, and was regarded as the value of x in Formula (1). The composition of each powder is shown below.

(Powder Composition)
Powder B1: $SrFe_{(9.71)}Al_{(2.29)}O_{19}$ and $SrAl_2O_4$
Powder B2: $SrFe_{(9.88)}Al_{(2.12)}O_{19}$ and $SrAl_2O_4$
Powder B3: $SrFe_{(9.94)}Al_{(2.06)}O_{19}$ and $SrAl_2O_4$
Powder B4: $SrFe_{(10.04)}Al_{(10.96)}O_{19}$ and $SrAl_2O_4$
Powder B5: $SrFe_{(10.10)}Al_{(10.90)}O_{19}$ and $SrAl_2O_4$
Powder B6: $SrFe_{(10.26)}Al_{(174)}O_{19}$ and $SrAl_2O_4$ Table 4 shows the ratio x' of aluminum atoms to 100 atom % of iron atoms in each powder of the powder B1 to the powder B6.

Since each powder of the powder B1 to the powder B6 contained a specific compound, none of the ratio x' of aluminum atoms to 100 atom % of iron atoms in each powder was the same value as x in Formula (1).

The content of $SrAl_2O_4$, which is the specific compound contained in each powder of the powder B1 to the powder B6, was measured by the following method.

In the following method, the specific compound $SrAl_2O_4$ was measured assuming that the entire $SrAl_2O_4$ was crystals.

The powder X-ray diffraction (XRD) measurement of each of the powders was carried out using a powder X-ray diffractometer (product name: X'Pert Pro, PANalytical) under the following measurement conditions.

—Measurement Conditions—
X-ray source: CuKα ray
[Wavelength: 1.54 Å (0.154 nm), output: 40 mA, 45 kV]
Scan range: $20°<2\theta<70°$
Scan interval: 0.05°
Scan speed: 0.33°/min Then, by comparing the peak intensity of the standard sample of $SrAl_2O_4$ with the peak intensity of $SrAl_2O_4$ in each powder of the powder B1 to the powder B6, the content of $SrAl_2O_4$ contained in each powder of the powder B1 to the powder B6 was determined. The content of $SrAl_2O_4$ contained in each powder is shown below.

(Content of $SrAl_2O_4$)
Powder B1: 8.8% by mass
Powder B2: 5.7% by mass
Powder B3: 3.7% by mass
Powder B4: 2.4% by mass
Powder B5: 1.3% by mass
Powder B6: 0.6% by mass <Resonance Frequency of Radio Wave Absorber>

For each radio wave absorber of the radio wave absorber A1 to the radio wave absorber A8 and the radio wave absorber B1 to the radio wave absorber B6, a peak frequency of the transmission attenuation amount was obtained, and this peak frequency was taken as the resonance frequency.

Specifically, as a measurement device, an S parameter was measured by setting an incidence angle to 0° and a sweep frequency of 60 GHz to 90 GHz by a free space method using a vector network analyzer (product name: N5225B) of Keysight Technologies and a horn antenna (product name: RH12S23) of KEYCOM Corp. From this S parameter, a peak frequency of permeability μ" of the imaginary part was calculated using the Nicholson-Loss model method and this peak frequency was used as the resonance frequency. The results are shown in Table 3 and Table 4.

<Magnetic Field Strength Hα of Powder>

The magnetic field strength Hα of each powder of the powder A1 to the powder A8 and the powder B1 to the powder B6 was determined.

Specifically, it was determined as follows.

As the measurement device, a vibrating sample magnetometer (model number: TM-TRVSM5050-SMSL, Tamagawa Manufacturing Co., Ltd.) was used as the device under an environment of an ambient temperature of 23° C. and under the conditions of a maximum applied magnetic field of 50 kOe, and a magnetic field sweep rate of 25 Oe/s (second), and the intensity of magnetization of the powder with respect to the applied magnetic field was measured. From the measurement results, a magnetic field (H)-magnetization (M) curve of each powder was obtained. Based on the obtained magnetic field (H)-magnetization (M) curve, a magnetic field strength which corresponds to 90% of a magnetization quantity at an applied magnetic field of 50 kOe was determined, and this magnetic field strength was denoted by Hα. The results are shown in Table 3 and Table 4.

TABLE 3

|  | Powder A1 | Powder A2 | Powder A3 | Powder A4 | Powder A5 | Powder A6 | Powder A7 | Powder A8 |
|---|---|---|---|---|---|---|---|---|
| Value of x' | 2.35 | 2.28 | 2.21 | 2.14 | 2.00 | 1.87 | 1.80 | 2.00 |
| Resonance frequency [GHz] | 87.2 | 85.1 | 82.3 | 79.8 | 76.5 | 72.8 | 69.3 | 76.5 |
| Hα [kOe] | 27.2 | 26.5 | 25.9 | 25.2 | 23.9 | 22.6 | 21.9 | 23.9 |

TABLE 4

|  | Powder B1 | Powder B2 | Powder B3 | Powder B4 | Powder B5 | Powder B6 |
|---|---|---|---|---|---|---|
| Value of x' | 2.65 | 2.40 | 2.30 | 2.13 | 2.00 | 1.80 |
| Resonance frequency [GHz] | 85.1 | 80.0 | 78.0 | 75.0 | 73.0 | 68.0 |
| Hα [kOe] | 26.5 | 25.0 | 24.4 | 23.6 | 23.0 | 21.6 |

<Relationship Between x' Value and Resonance Frequency>

The relationship between the value of x' (that is, the ratio of aluminum atoms to 100 atom % of iron atoms) and the resonance frequency in the magnetoplumbite-type hexagonal ferrite powder (that is, the powder A1 to the powder A7) produced by the liquid phase method, and the relationship between the value of x' (that is, the ratio of aluminum atoms to 100 atom % of iron atoms) and the resonance frequency in the magnetoplumbite-type hexagonal ferrite powder (that is, the powder B1 to the powder B6) produced by the solid phase method are shown in FIG. 1.

<Relationship Between Hα Value and Resonance Frequency>

Figure 2:
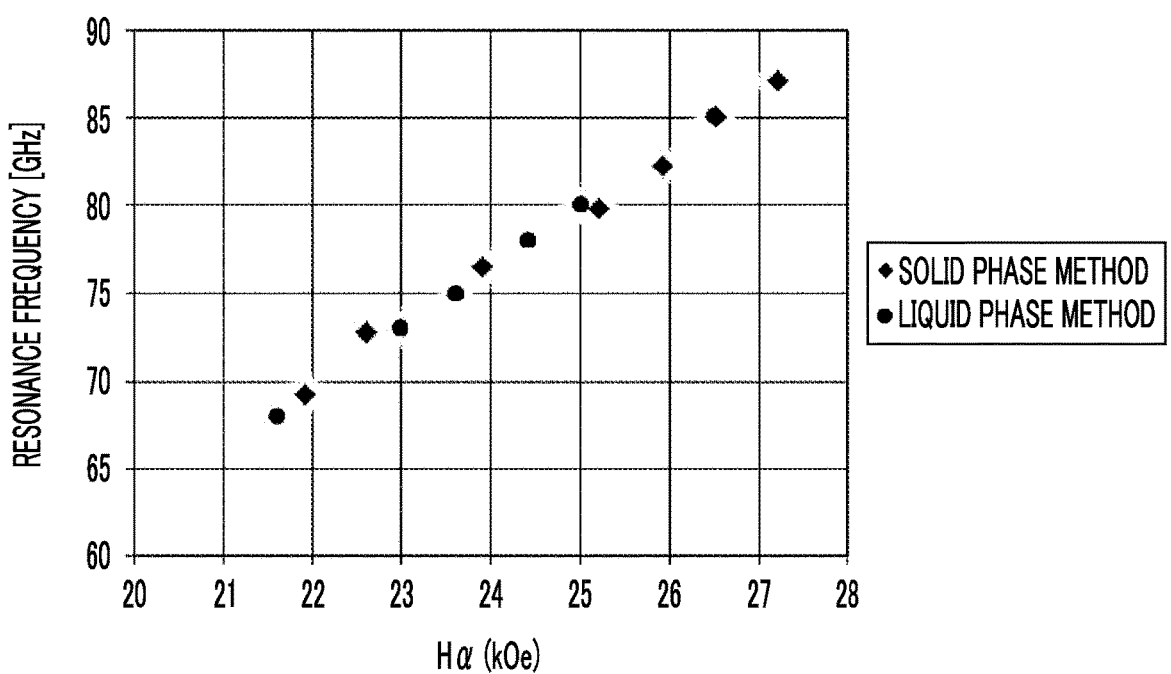
FIG. 2 is a graph showing a relationship between a value of Hα and a resonance frequency in a powder A1 to a powder A7, prepared by the liquid phase method, and a relationship between the value of Hα and a resonance frequency in a powder B1 to a powder B6, prepared by the solid phase method.

The relationship between the value of Hα (that is, the magnetic field strength which corresponds to 90% of a magnetization quantity obtained in a case where an external magnetic field of 50 kOe is applied) and the resonance frequency in the magnetoplumbite-type hexagonal ferrite powder (that is, the powder A1 to the powder A7) produced by the liquid phase method, and the relationship between the value of Hα (that is, the magnetic field strength which corresponds to 90% of a magnetization quantity obtained in a case where an external magnetic field of 50 kOe is applied) and the resonance frequency in the magnetoplumbite-type hexagonal ferrite powder (that is, the powder B1 to the powder B6) produced by the solid phase method are shown in FIG. 2.

As shown in FIG. 1, Table 3, and Table 4, it has been confirmed that the tendency of the relationship between the value of x' and the resonance frequency in the powder produced by the solid phase method is different from that of the relationship between the value of x' and the resonance frequency in the powder produced by the liquid phase method, and the deviation occurs.

The reason for such a deviation is presumed to be that a specific compound is generated in the powder mass-produced by the solid phase method.

On the other hand, as shown in FIG. 2, Table 3, and Table 4, the tendency of the relationship between the value of Hα and the resonance frequency in the powder produced by the solid phase method is the same as that of the relationship between the value of Hα and the resonance frequency in the powder produced by the liquid phase method.

From the above results, it has been found that there is a correlation between the value of Hα and the resonance frequency in the magnetoplumbite-type hexagonal ferrite powder, and the resonance frequency of the magnetoplumbite-type hexagonal ferrite powder can be satisfactorily controlled by adjusting the value of Hα of the magnetoplumbite-type hexagonal ferrite powder even in a case where a specific compound is contained.

The contents of JP2019-051927 filed on Mar. 19, 2019, and JP2019-117629 filed on Jun. 25, 2019, are incorporated in the present specification by reference in its entirety.

All of the documents, the patent applications, and the technology standards described here are incorporated in the present specification by reference.

What is claimed is:

1. A magnetoplumbite-type hexagonal ferrite powder, comprising:
   a powder of a compound represented by Formula (1); and
   a powder of a compound represented by Formula (2),
   wherein a magnetic field strength Ha, which corresponds to 90% of a magnetization quantity obtained in a case where an external magnetic field of 50 kOe is applied, satisfies 19 kOe≤Hα≤28 kOe:

$$AFe_{(12-x)}Al_xO_{19} \quad \text{Formula (1)}$$

wherein in Formula (1), A represents at least one metal element selected from the group consisting of Sr, Ba, Ca, and Pb, and x satisfies 1.5≤x≤8.0; and $$A^aAl_2O_4 \quad \text{Formula (2)}$$

wherein in Formula (2), $A^a$ represents at least one metal element selected from the group consisting of Sr, Ba, Ca, and Pb,
   wherein a ratio x' of aluminum atoms with respect to 100 atom % of iron atoms in the magnetoplumbite-type hexagonal ferrite powder is from 1.80 to 2.65.

2. The magnetoplumbite-type hexagonal ferrite powder according to claim 1,
   wherein A in Formula (1) comprises Sr.

3. The magnetoplumbite-type hexagonal ferrite powder according to claim 1,
   wherein the magnetoplumbite-type hexagonal ferrite powder has been subjected to a surface treatment.

4. The magnetoplumbite-type hexagonal ferrite powder according to claim 1,
   wherein the surface treatment comprises at least one selected from the group consisting of an oil treatment, a silicone treatment, a fluorine compound treatment, a silane coupling agent treatment, a titanium coupling agent treatment, a metal soap treatment, an amino acid treatment, a lecithin treatment, a polyethylene treatment, a mechanochemical treatment, and a phosphoric acid compound treatment.

5. A radio wave absorber, comprising:
the magnetoplumbite-type hexagonal ferrite powder according to claim 1; and
a binder,
wherein the radio wave absorber has a planar shape.

6. A radio wave absorber, comprising:
the magnetoplumbite-type hexagonal ferrite powder according to claim 1; and
a binder,
wherein the radio wave absorber has a three-dimensional shape.

7. A method of controlling a resonance frequency of a magnetoplumbite-type hexagonal ferrite powder, the method comprising:
adjusting a magnetic field strength Ha which corresponds to 90% of a magnetization quantity obtained in a case where an external magnetic field of 50 kOe is applied to a magnetoplumbite-type hexagonal ferrite powder within a range satisfying 19 kOe≤Hα≤28 kOe, the magnetoplumbite-type hexagonal ferrite powder comprising a powder of a compound represented by Formula (1):

$$AFe_{(12-x)}Al_xO_{19} \qquad \text{Formula (1)}$$

wherein in Formula (1), A represents at least one metal element selected from the group consisting of Sr, Ba, Ca, and Pb, and x satisfies 1.5≤x≤8.0 wherein the magnetoplumbite-type hexagonal ferrite powder comprises a compound represented by Formula (2):

$$A^a Al_2 O_4 \qquad \text{Formula (2)}$$

wherein in Formula (2), $A^a$ represents at least one metal element selected from the group consisting of Sr, Ba, Ca, and Pb, and
wherein a ratio x' of aluminum atoms with respect to 100 atom % of iron atoms in the magnetoplumbite-type hexagonal ferrite powder is from 1.80 to 2.65.

* * * * *